(12) United States Patent
Tan

(10) Patent No.: US 12,046,272 B2
(45) Date of Patent: Jul. 23, 2024

(54) MEMORY SYSTEM AND CONTROL METHOD OF MEMORY SYSTEM

(71) Applicant: Kioxia Corporation, Tokyo (JP)

(72) Inventor: Mel Stychen Sanchez Tan, Kawasaki (JP)

(73) Assignee: Kioxia Corporation, Tokyo (JP)

( * ) Notice: Subject to any disclaimer, the term of this patent is extended or adjusted under 35 U.S.C. 154(b) by 256 days.

(21) Appl. No.: 17/651,309

(22) Filed: Feb. 16, 2022

(65) Prior Publication Data
US 2023/0091384 A1 Mar. 23, 2023

(30) Foreign Application Priority Data
Sep. 14, 2021 (JP) ................................ 2021-149340

(51) Int. Cl.
| G11C 11/4093 | (2006.01) |
| G11C 5/14 | (2006.01) |
| G11C 11/4074 | (2006.01) |
| G11C 11/4096 | (2006.01) |

(52) U.S. Cl.
CPC .......... *G11C 11/4093* (2013.01); *G11C 5/141* (2013.01); *G11C 11/4074* (2013.01); *G11C 11/4096* (2013.01)

(58) Field of Classification Search
CPC ................................................. G11C 11/4093
See application file for complete search history.

(56) References Cited

U.S. PATENT DOCUMENTS

| 10,656,848 | B2* | 5/2020 | Borlick ................... G06F 3/065 |
| 11,379,027 | B2* | 7/2022 | Masubuchi ............... G06F 1/28 |
| 2010/0008175 | A1* | 1/2010 | Sweere .................. G11C 11/005 |
| | | | 365/228 |
| 2012/0221891 | A1* | 8/2012 | Shimizu .................... G06F 1/30 |
| | | | 714/15 |
| 2015/0279463 | A1* | 10/2015 | Berke .................... G11C 29/02 |
| | | | 711/105 |
| 2016/0254031 | A1 | 9/2016 | Noguchi et al. |
| 2019/0384872 | A1 | 12/2019 | Chung |
| 2020/0064897 | A1 | 2/2020 | Nomura |
| 2021/0004164 | A1 | 1/2021 | Yun |
| 2021/0074336 | A1* | 3/2021 | Kumagai ............... G11C 5/141 |

FOREIGN PATENT DOCUMENTS

CN          112185440 A      1/2021

* cited by examiner

*Primary Examiner* — Douglas King
(74) *Attorney, Agent, or Firm* — Oblon, McClelland, Maier & Neustadt, L.L.P.

(57) ABSTRACT

According to one embodiment, a memory system includes a controller controls writing data to a non-volatile memory and a volatile memory, a power supply circuit generates voltages with a first voltage externally supplied and supplies the voltages to the non-volatile memory, volatile memory, and controller, and a backup power supply circuit. The power supply circuit, when the first voltage drops irrespective of a shutdown command, generates the voltages with an output voltage of the backup power supply circuit. The controller changes a size of data storable in the volatile memory in accordance with a supply capability fed from the backup power supply circuit.

18 Claims, 17 Drawing Sheets

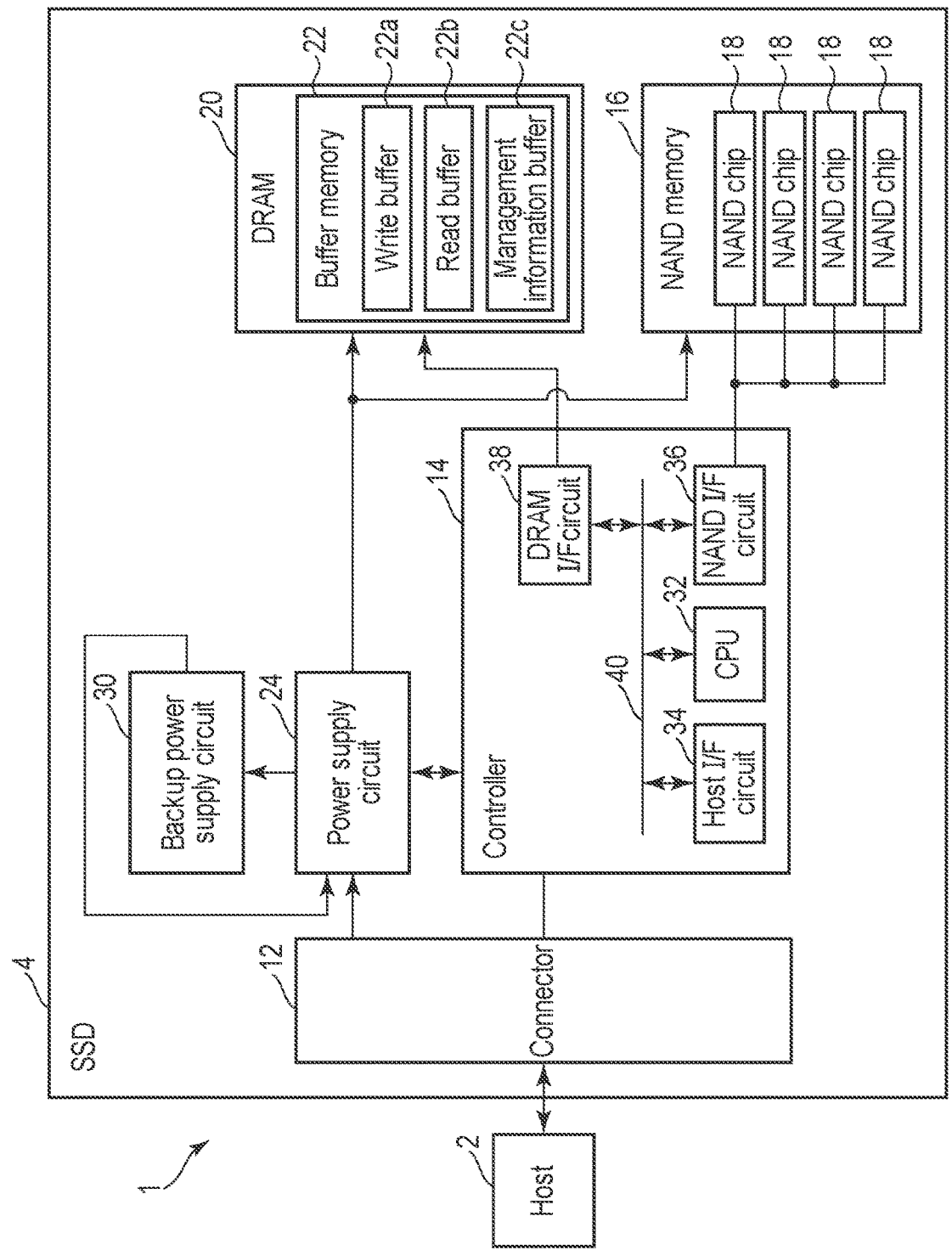
F I G. 1

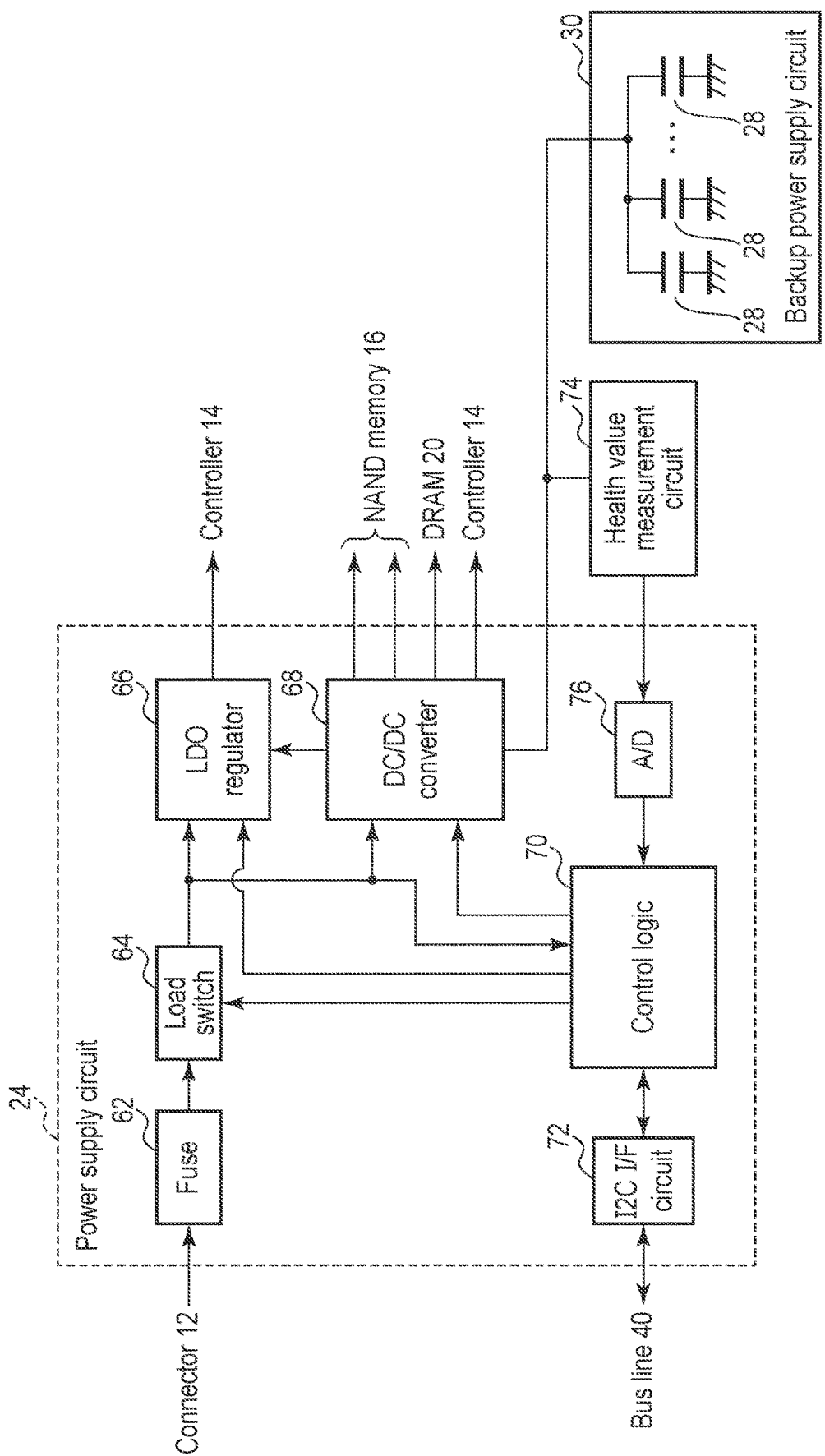
F I G. 4

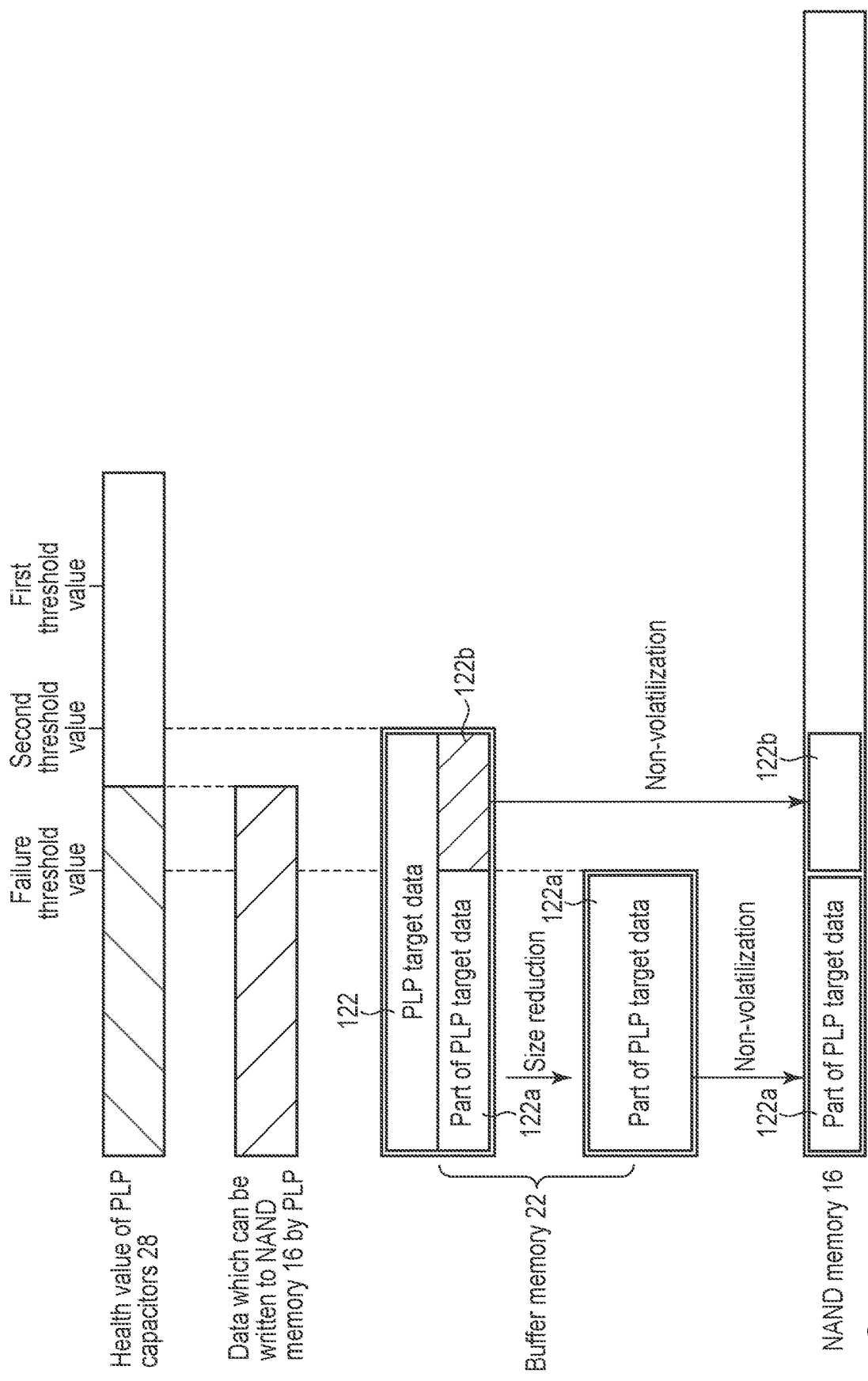
F I G. 10

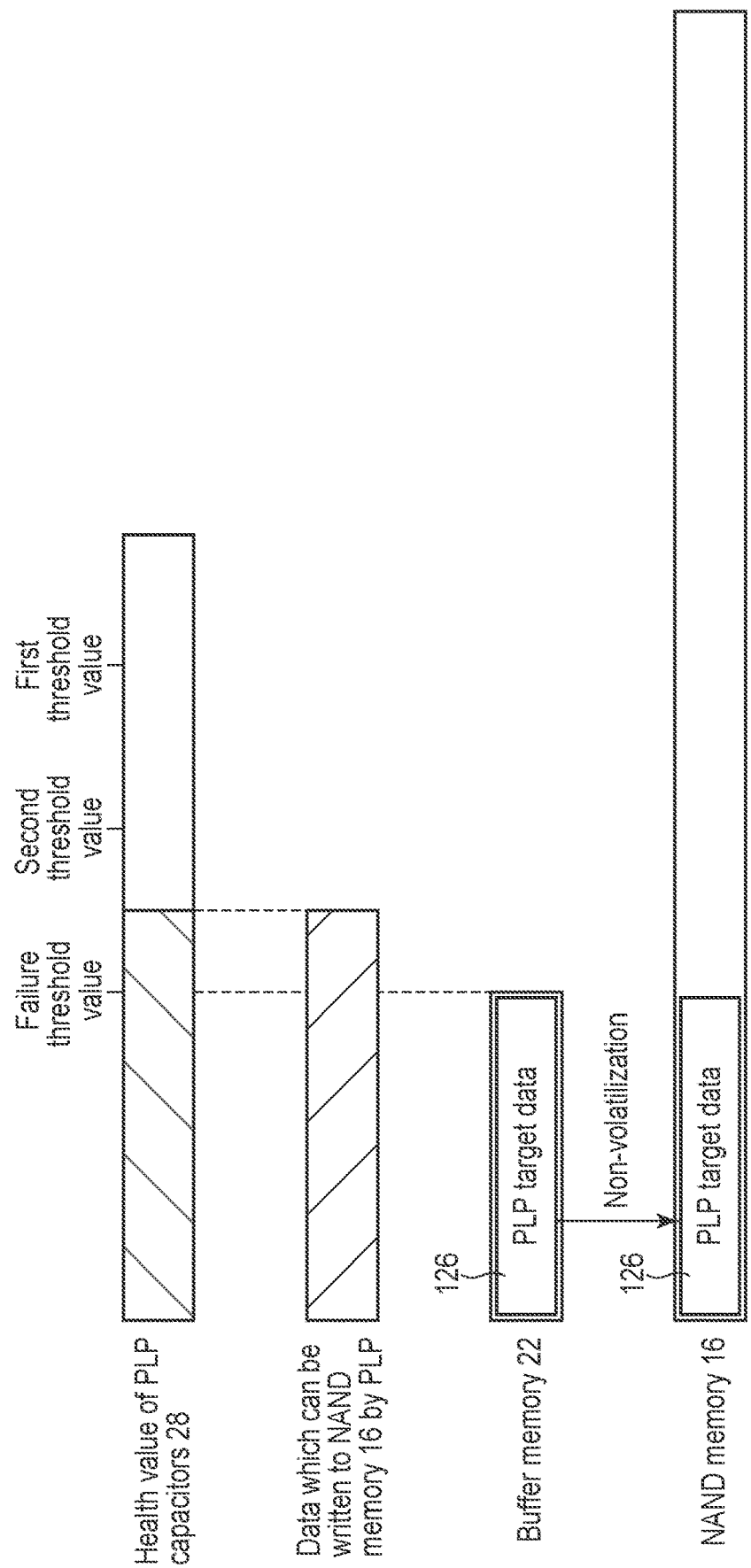
F I G. 11

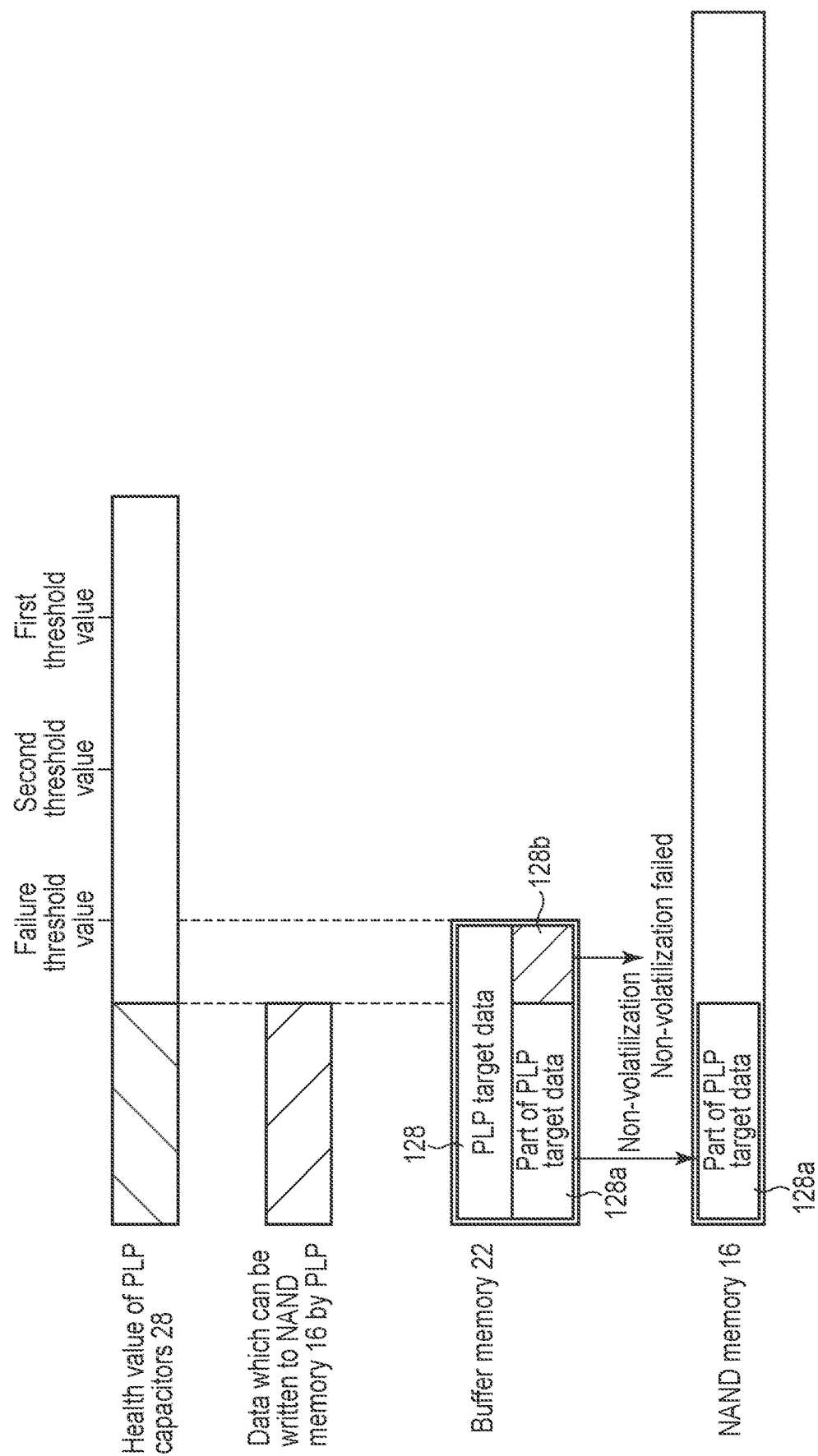
F I G. 12

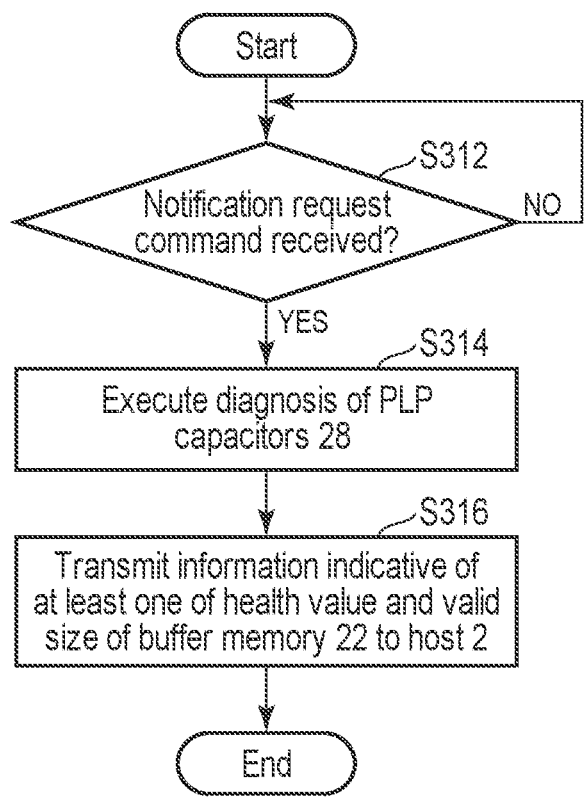
F I G. 17

MEMORY SYSTEM AND CONTROL METHOD OF MEMORY SYSTEM

CROSS-REFERENCE TO RELATED APPLICATIONS

This application is based upon and claims the benefit of priority from Japanese Patent Application No. 2021-149340, filed Sep. 14, 2021, the entire contents of which are incorporated herein by reference.

FIELD

Embodiments described herein relate generally to a memory system including a non-volatile memory.

BACKGROUND

A solid state drive (SSD) is known as an example of a memory system including a non-volatile memory. In the SSD, data transmitted from an external device called host is once written to a volatile memory that serves as a buffer memory. The data stored in the buffer memory is written to a non-volatile memory. When receiving a command to instruct shutdown (referred to hereinafter as a shutdown command) from the host, the SSD writes all the data stored in the buffer memory to the non-volatile memory and then shuts down the power. For example, a DRAM or the like is used as the volatile memory and, for example, a NAND flash memory or the like is used as the non-volatile memory.

Some SSDs include a power loss protection (PLP) function that prevents the loss of data in the buffer memory in the event of not a power shutdown executed with the shutdown command, but an unexpected power shutdown (i.e., improperly power shutdown) such as a power failure. The PLP function requires a backup power supply. A capacitor (referred to as a PLP capacitor) is used as an example of the backup power supply. The PLP capacitor can be charged to a predetermined voltage by storing electric charges in the capacitor. If the power supply is unexpectedly shut down for some reason, the electric charges stored in the PLP capacitor are emitted and the charged voltage is discharged. The SSD can operate for a predetermined period using the discharged voltage from the PLP capacitor. For example, if the power supply is unexpectedly shut down while data from the host is stored in the buffer memory, the data stored in the buffer memory can be written to the non-volatile memory with the discharged voltage from the PLP capacitor. Such a function is referred to as a PLP function.

In the PLP capacitor, the capacitance (electrostatic capacitance) of the capacitor capable of storing the electric charge often decreases due to aging degradation or the like. If the electrostatic capacitance of the capacitor decreases due to aging degradation or the like, for example, the capacitor cannot be charged to the voltage level required to write the data written to the buffer memory to the non-volatile memory, and the function of the PLP capacitor cannot be implemented.

BRIEF DESCRIPTION OF THE DRAWINGS

FIG. 1 is a block diagram showing an example of an information processing system according to a first embodiment.

FIG. 4 is a block diagram showing an example of a configuration of a power supply system according to the first embodiment.

FIG. 10 is a view illustrating the PLP function according to the first embodiment in a case where the health value is smaller than the second threshold value and larger than or equal to the failure threshold value.

FIG. 11 is a view illustrating the PLP function according to the first embodiment in a case where the health value is smaller than the second threshold value and larger than or equal to the failure threshold value.

FIG. 12 is a view illustrating the PLP function according to the first embodiment in a case where the health value is smaller than the failure threshold value.

FIG. 17 is a flowchart showing an example of processing of the controller 14 executing the PLP function according to a fourth embodiment.

DETAILED DESCRIPTION

Figure 2:
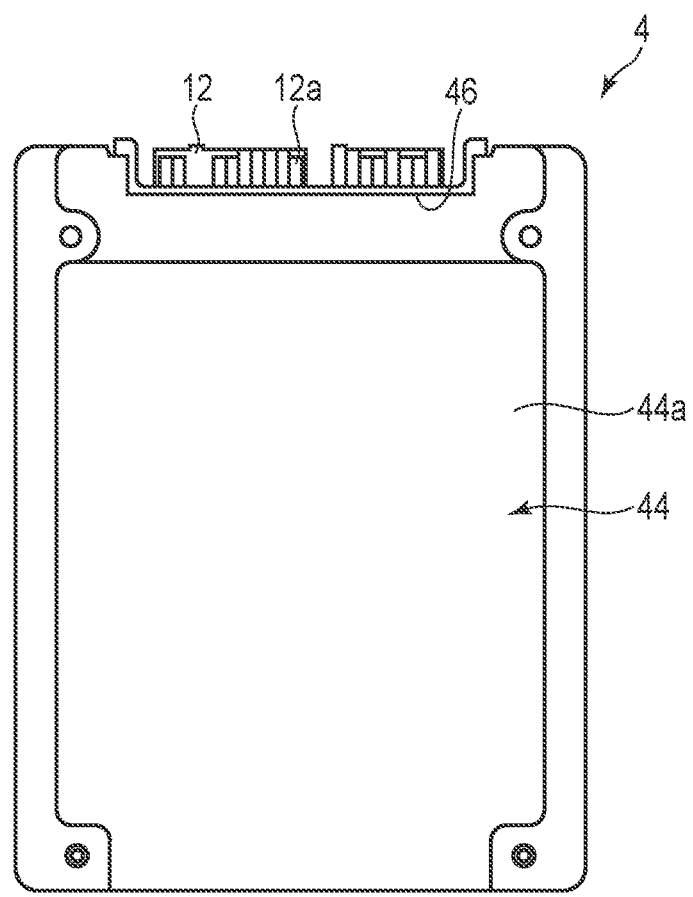
FIG. 2 is a plan view showing an example of an appearance of an SSD according to the first embodiment.

Various embodiments will be described hereinafter with reference to the accompanying drawings.

The disclosure is merely an example and is not limited by contents described in the embodiments described below. Modification which is easily conceivable by a person of ordinary skill in the art comes within the scope of the disclosure as a matter of course. In order to make the description clearer, the sizes, shapes, and the like of the respective parts may be changed and illustrated schematically in the drawings as compared with those in an accurate representation. Constituent elements corresponding to each other in a plurality of drawings are denoted by like reference numerals and their detailed descriptions may be omitted unless necessary.

In general, according to one embodiment, a memory system comprising a non-volatile memory; a volatile memory; a controller configured to control writing data to the non-volatile memory and writing data to the volatile memory; a power supply circuit coupled to the non-volatile memory, the volatile memory, and the controller and configured to generate voltages with a first voltage which is externally supplied and supply the voltages to the non-volatile memory, the volatile memory, and the controller; and a backup power supply circuit. The power supply circuit is configured to, when the first voltage drops irrespective of a shutdown command, generate the voltages with an output voltage of the backup power supply circuit. The controller is configured to change a size of data storable in the volatile memory in accordance with a supply capability fed from the backup power supply circuit.

FIG. 1 is a block diagram showing an example of an information processing system 1 according to a first embodiment. The information processing system 1 includes a memory system 4 and a host device (hereinafter simply referred to as a host) 2 which is connectable to the memory system 4. The memory system 4 is a storage device configured to write data to a non-volatile memory 16 and read data from the non-volatile memory 16. In the present specification, the memory system 4 is, for example, the SSD. Examples of the non-volatile memory are a NAND flash memory, a NOR flash memory, a magneto-resistive random access memory (MRAM), a phase change random access memory (PRAM), a resistive random access memory (ReRAM), a ferroelectric random access memory (FeRAM), and the like. In the present specification, the non-volatile memory 16 is, for example, the NAND flash memory (hereinafter simply referred to as a NAND memory). As described above, the information processing system 1 includes the host 2 and the SSD 4 connected to the host 2.

The host 2 is an information processing device serving as an external device which accesses the SSD 4. The host 2 may be a server (storage server) which stores a large amount of data and a wide variety of data in the SSD 4. The host 2 may be a personal computer. The SSD 4 may be an SSD for business use which is incorporated into a server such as a data center. The SSD 4 may be an SSD for personal use which is incorporated into a personal computer.

The SSD 4 includes a connector 12, a controller 14, a NAND memory 16, a dynamic random access memory (DRAM) 20, a power supply circuit 24, and a backup power supply circuit 30 which includes a plurality of capacitors. The SSD 4 can be used as a main storage of the host 2. The SSD 4 may be built in the host 2, provided outside the host 2, or connected to the host 2 via a cable or a network.

The controller 14 writes data to the NAND memory 16 and reads data from the NAND memory 16 according to a command (request) transmitted from the host 2. Furthermore, the controller 14 generates a control signal to control the value of the voltage generated by the power supply circuit 24 according to the command transmitted from the host 2 and various information transmitted from the power supply circuit 24. The controller 14 transmits the generated control signal to the power supply circuit 24. When receiving this control signal, the controller 14 controls voltages supplied to each of devices (for example, the NAND memory 16, the controller 14, and the DRAM 20) of the SSD 4. In addition, the controller 14 also controls the execution of the PLP function. The controller 14 can be configured by a circuit such as a System on a Chip (SoC).

The power supply circuit 24 generates voltages necessary for each device of the SSD 4 from a single voltage or a plurality of voltages supplied from the outside. A power supply of the voltages supplied from the outside may be an internal power supply or an external power supply. The external power supply may be the power supply of the host 2. In FIG. 1, the power supply is the power supply of the host 2, but the power supply line is not shown in the figure. The power supply circuit 24 can also generate voltages necessary for each device of the SSD 4 from the voltage supplied from the backup power supply circuit 30. The power supply circuit 24 may be a single integrated circuit (IC) or a plurality of ICs. Information indicating various states of the power supply circuit 24 is transmitted to the controller 14 according to a predetermined communication standard. The predetermined communication standard may be a serial communication standard. One of examples of the serial communication standard is the I2C format. In the present specification, it is assumed that the communication standard between the power supply circuit 24 and the controller 14 is based on the I2C format.

The DRAM 20 is an example of the volatile memory. The DRAM 20 is, for example, a DRAM of Double Data Rate 3 Low voltage (DDR3L) standard. The DRAM 20 includes a buffer memory 22. The buffer memory 22 includes a write buffer 22a, a read buffer 22b, and a management information buffer 22c. Data transmitted from the host 2 to the SSD 4, which is being written or is not written to the NAND memory 16, is stored in the write buffer 22a. Data read from the NAND memory 16, which is being transmitted or is not transmitted to the host 2, is stored in the read buffer 22b. A lookup table, various tables used during operation of the SSD 4, and various values are stored in the management information buffer 22c. One of examples of the various values is an address of a block whose data has been written to the NAND memory 16 by the PLP function, i.e., an address of a non-volatilized block. The lookup table indicates a correspondence between a logical address specified by the host 2 and a physical address of the NAND memory 16.

The DRAM 20 serving as the volatile memory may be provided not only outside the controller 14, but also inside the controller 14. As the volatile memory, a static random access memory (SRAM) capable of making a faster access may be used instead of the DRAM 20.

The NAND memory 16 may include a plurality of (for example, sixteen) NAND chips 18. Each of the NAND chips 18 may include a memory cell array including a plurality of memory cells arrayed in a matrix. The NAND chips 18 may be formed of a memory cell array having a two-dimensional structure or formed of a memory cell array having a three-dimensional structure.

The memory cell array includes a plurality of blocks. Each of the blocks includes a plurality of pages. The block functions as a unit of a data erase operation. Each of the plurality of pages includes a plurality of memory cells connected to the same word line. The page is a unit of a data write operation and a data read operation.

The data of one page is stored in the write buffer 22a as data of a write unit or in the read buffer 22b as data of a read unit. When writing, the data of the write unit of one page read from the write buffer 22a is written to the NAND memory 16. When not a power shutdown caused by issuing the shutdown command, but an unexpected power shutdown occurs and the power supply circuit 24 does not generate the voltage during writing, the data in the write buffer 22a which is being written or is not written to the NAND memory 16 is lost. At this time, the data in the read buffer 22b and the management information buffer 22c are also lost similarly to the data in the write buffer 22a. If SSD 4 receives the shutdown command, the controller 14 writes the data in the buffer memory 22 to the NAND memory 16 and then stops the operation of the power supply circuit 24.

In the first embodiment, the backup power supply circuit 30 is provided. At the unexpected power shutdown, the controller 14 can write the data in the buffer memory 22 to the NAND memory 16 by using the backup power supply circuit 30.

The controller 14 generates a control signal to control the value of the voltage generated by the power supply circuit 24, according to the command (request) transmitted from the host 2 and various information transmitted from the power supply circuit 24. The controller 14 transmits the generated control signal to the power supply circuit 24. Thus, the plurality of voltages supplied to each device of the SSD 4 are controlled by the controller 14.

The backup power supply circuit 30 is connected to the power supply circuit 24. When not a power shutdown caused by the shutdown command, but an unexpected power shutdown occurs, the backup power supply circuit 30 supplies to the power supply circuit 24 a voltage to protect the data which is being written or is not written to the NAND memory 16. The backup power supply circuit 30 is formed of a plurality of PLP capacitors connected parallel. The PLP capacitors are described later with reference to FIG. 3. Examples of the PLP capacitors include an electric double-layer capacitor, a conductive polymer aluminum electrolytic capacitor, a conductive polymer tantalum solid electrolytic capacitor, and the like.

The power supply circuit 24 includes a PLP function which continues supplying the voltage to the NAND memory 16, the controller 14, and the DRAM 20 by using a supply capability fed from the backup power supply circuit 30 for a certain period of time even if not a power shutdown caused by the shutdown command, but an unexpected power shutdown occurs. When an unexpected power shutdown occurs, the controller 14 transmits a command to execute the PLP function to the power supply circuit 24.

The supply capability corresponds to a synthetic electrostatic capacitance (total capacitance) accumulated by the plurality of PLP capacitors included in the backup power supply circuit 30. The synthetic electrostatic capacitance is set in accordance with the time (backup time) in which the power supply circuit 24 supplies the voltage to execute the PLP function to the NAND memory 16, the controller 14, and the DRAM 20 after the power shutdown. This synthetic electrostatic capacitance (often simply referred to as an electrostatic capacitance of the PLP capacitor in the following descriptions) is set to be slightly larger than the electrostatic capacitance causing completion of writing the data stored in the buffer memory 22 to the NAND memory 16 within this voltage supply time, i.e., completion of non-volatilization. This is because, by providing a margin in the electrostatic capacitance of the PLP capacitor, non-volatilization of the data stored in the buffer memory 22 can be completed within this voltage supply time, i.e., the PLP function can be realized even if the electrostatic capacitance of the PLP capacitor is slightly reduced due to aging degradation or the like.

The controller 14 includes a CPU 32, a host interface (host I/F) circuit 34, a NAND interface (NAND I/F) circuit 36, and a DRAM interface (DRAM I/F) circuit 38. The CPU 32, the host I/F circuit 34, the NAND I/F circuit 36, and the DRAM I/F circuit 38 are connected to a bus line 40. Although not directly illustrated, the power supply circuit 24 is also connected to the bus line 40.

The CPU 32 executes firmware stored in the NAND memory 16 to realize various functions. Examples of the various functions include charge control of the backup power supply circuit 30 and control of the PLP function using the power supply circuit 24.

The host I/F circuit 34 is electrically connected to the host 2 via the connector 12. The NAND I/F circuit 36 is electrically connected to the NAND memory 16. The DRAM I/F circuit 38 is electrically connected to the DRAM 20.

The host I/F circuit 34, which electrically connects the host 2 to the SSD 4, conforms to standards such as Small Computer System Interface (SCSI), Serial Attached SCSI (SAS), AT Attachment (ATA), Serial ATA (SATA), PCI Express (PCIe)™, Ethernet™, Fibre Channel™, NVM Express (NVMe)™, Universal Serial Bus (USB)™, and Universal Asynchronous Receiver/Transmitter (UART)™.

The NAND I/F circuit 36, which electrically interconnects the controller 14 and the NAND memory 16, conforms to standards such as Toggle DDR and Open NAND Flash Interface (ONFI). The NAND I/F circuit 36 is connected to the NAND memory 16 via a plurality of (for example, eighteen) channels.

FIG. 2 is a plan view showing an example of an appearance of the SSD 4 according to the first embodiment. The SSD 4 is disposed in a casing 44. A notch 46 is provided at one end of the casing 44. A connector 12 is provided in the notch 46. The connector 12 includes a plurality of pins 12a including signal pins and power pins. The casing 44 includes an upper casing 44a and a lower casing (not shown). The upper casing 44a and the lower casing are integrated by screws.

Figure 3A:
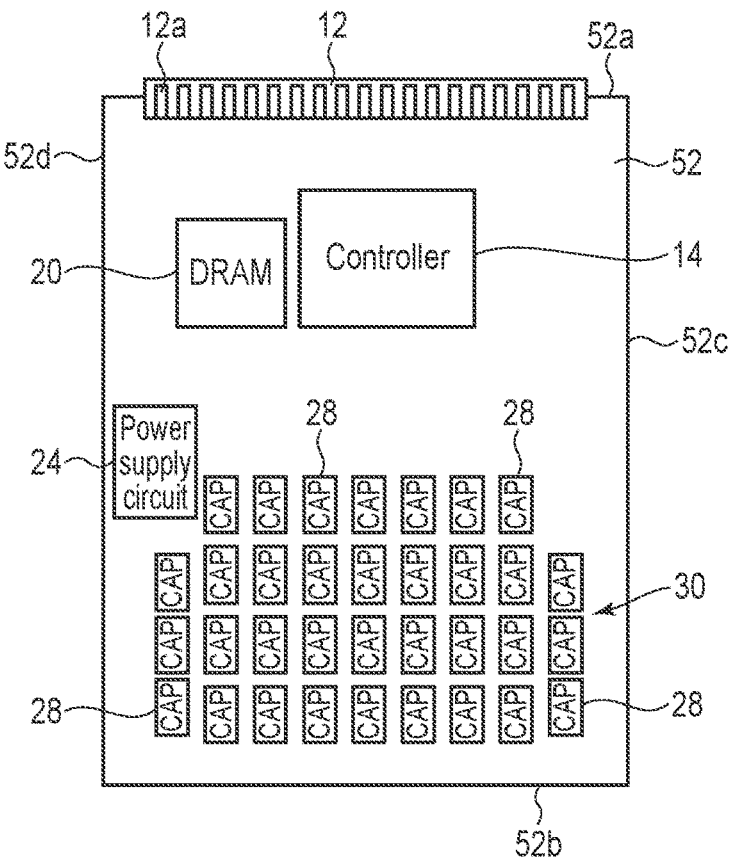
FIGS. 3A and 3B are plan views showing an example of an arrangement of components of the SSD according to the first embodiment.
Figure 3B:
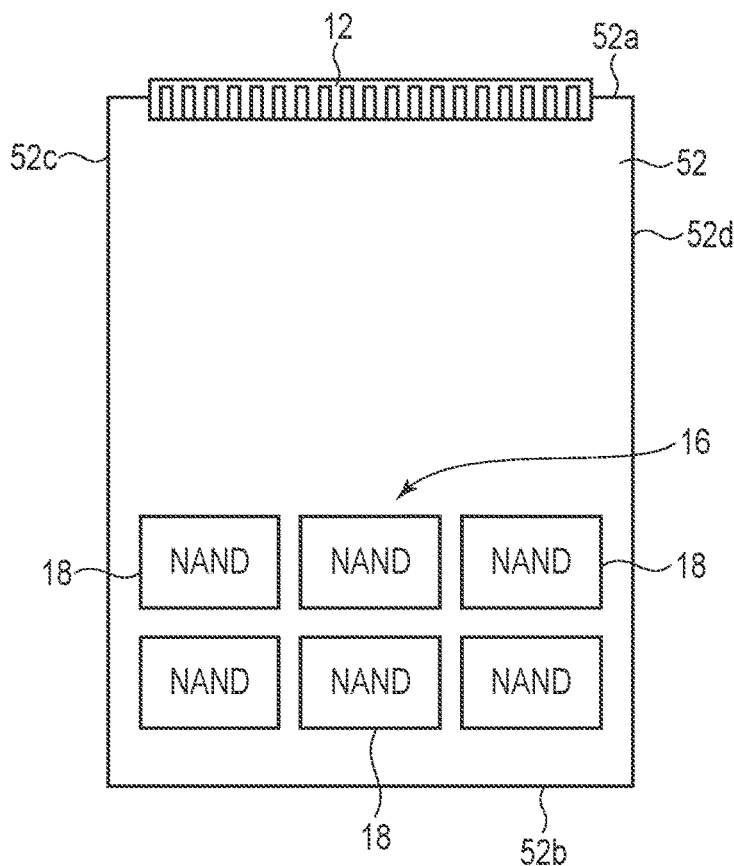

FIGS. 3A and 3B are plan views showing an example of an arrangement of components of the SSD 4 according to the first embodiment. FIG. 3A shows a surface of a substrate 52 of the SSD 4 (i.e., the surface opposed to the upper casing 44a). The shape of the substrate 52 is a rectangle having four sides 52a, 52b, 52c, and 52d. The connector 12 is provided on one side 52a of the short sides. The pins 12a of the connector 12 are disposed on the surface of the substrate 52. The controller 14, the DRAM 20, the power supply circuit 24, and the backup power supply circuit 30 are disposed on the surface of the substrate 52. FIG. 3B shows a back surface (i.e., a surface opposed to the lower casing) of the substrate 52. The NAND chips 18 are disposed on the back surface of the substrate 52.

The controller 14 is disposed in the vicinity of the connector 12 since the controller 14 processes high-speed signals input or output via the connector 12. More specifically, the controller 14 is disposed between a line connecting midpoints of respective long sides 52c and 52d, and the short side 52a on the connector 12 side. The DRAM 20 is disposed in the vicinity of the controller 14.

The PLP capacitors 28 constituting the backup power supply circuit 30 are intensively disposed between a line connecting the midpoints of the respective long sides 52c and 52d of the substrate 52, and the short side 52b opposite to the connector 12. The controller 14 is the largest heat source of the components on the substrate 52. The PLP capacitors 28 are degraded by heat but, since the PLP capacitors 28 are disposed to be separated as far as possible from the controller 14, degradation caused by heat is minimized.

Similarly to the PLP capacitors 28, the NAND chips 18 have a low resistance to heat. The NAND chips 18 are provided on a surface opposite to the surface on which the controller 14 and the PLP capacitors 28 are disposed. For example, the NAND chips 18 are intensively disposed between the line connecting the midpoints of the respective long sides 52c and 52d of the substrate 52, and the short side 52b opposite to the connector 12. Thus, since the NAND chips 18 are disposed to be separated as far as possible from the controller 14, the NAND chips 18 are prevented from being affected by heat.

The NAND chips 18 have a smaller influence to the PLP capacitors 28 as compared with the controller 14, but generate some heat. The PLP capacitors 28 are desirably disposed at positions separated from the NAND chips 18 as shown in the figure. Even if the layout design is executed by thus considering thermal effects between the components in the SSD 4, the PLP capacitors 28 may be deteriorated and the PLP function may not be operated properly due to other external factors and the like. Thus, the present embodiment includes a power supply system as described below in detail.

FIG. 4 is a block diagram showing an example of a configuration of a power supply system including the power supply circuit 24, the backup power supply circuit 30 including the PLP capacitors 28, and a health value measurement circuit 74, according to the first embodiment.

The power supply circuit 24 includes a fuse 62, a load switch 64, a Low Dropout (LDO) regulator 66, DC/DC converter 68, a control logic 70, an I2C I/F circuit 72, and an A/D converter (A/D) 76. A power supply (not shown) generates a voltage, for example, a voltage of DC12V. A current of a magnitude corresponding to the voltage is supplied to the LDO regulator 66 and the DC/DC converter 68 through the fuse 62 and the load switch 64 in series. The host 2 may include a power supply, and the current corresponding to the voltage may be supplied from the host 2 to the power supply circuit 24. A single IC or a plurality of ICs constituting the power supply circuit 24 may be referred to as power management IC (PMIC).

The fuse 62 is formed of a metal fuse which is blown when an overcurrent higher than or equal to a certain current flows thereto. When the fuse 62 is blown, the voltage is not supplied to the load switch 64 unless the fuse is replaced. The fuse 62 is not limited to a metal fuse, but may also be formed of an electronic fuse which becomes nonconductive when an overcurrent is detected.

The load switch 64 is an on/off switch and is normally in the on state. In the on state, the load switch 64 outputs a voltage obtained by subtracting the dropout voltage from the supplied voltage. Similarly to the fuse 62, the load switch 64 becomes in an off state when an overcurrent higher than or equal to a certain current flows thereto. In the off state, the load switch 64 outputs 0V. The value of the overcurrent at which the fuse 62 is blown may be higher, lower, or the same as the value of the overcurrent at which the load switch 64 changes from the on state to the off state. Supply of the overcurrent to the LDO regulator 66 and the DC/DC converter 68 is prevented in duplicate manners, by the fuse 62 and the load switch 64.

The LDO regulator 66 is a circuit for generating a voltage (or voltages) of a device (or devices) of the SSD 4 which requires a small current. The DC/DC converter 68 is a circuit for generating a voltage (or voltages) of a device (or devices) of the SSD 4 which requires a large current. The LDO regulator 66 may be formed of independent ICs or a single IC. The DC/DC converter 68 may also be formed of independent ICs or a single IC.

The LDO regulator 66 steps down the voltage output from the load switch 64. The voltage output from the LDO regulator 66 is supplied to the controller 14.

The DC/DC converter 68 boosts or steps down the output voltage of the load switch 64 to generate a voltage (or voltages) required by each of the devices (controller 14, NAND memory 16, DRAM 20, and the like) in the SSD 4. The DC/DC converter 68 is formed of a plurality of DC/DC converter units which boost or step down the plurality of voltages, respectively.

The boosting DC/DC converter unit boosts the output voltage of the load switch 64 and supplies the boosted voltage as a charging voltage to the plurality of PLP capacitors 28 connected in parallel. The plurality of PLP capacitors 28 constitute the backup power supply circuit 30.

The stepping-down DC/DC converter units respectively generate a plurality of voltages by stepping down the output voltage of the load switch 64. The voltages generated by the stepping-down DC/DC converter unit is supplied to the NAND memory 16, the DRAM 20, and the controller 14.

The control logic 70 monitors the output voltage of the load switch 64. When detecting that the output voltage has dropped to a predetermined voltage, for example, 0V, the control logic 70 transmits the detection result to the controller 14. When the controller 14 is notified that the output voltage of the load switch 64 has become 0V even though the controller 14 has not received the shutdown command, the controller 14 determines that an unexpected power shutdown not caused by the shutdown has occurred and transmits a PLP command to the control logic 70.

When receiving the PLP command, the control logic 70 causes the voltage (output voltage) charged by the PLP capacitors 28 to be input to the stepping-down DC/DC converter unit in the DC/DC converter 68. As a result, for a while after the power is unexpectedly shut down, the stepping-down DC/DC converter unit steps down the output voltage from the PLP capacitors 28, supplies the step-down voltage to the NAND memory 16, the DRAM 20, and the controller 14, and also supplies the step-down voltage to the LDO regulator 66. As a result, the DC/DC converter 68 and the LDO regulator 66 can supply the voltage (or voltages) generated by stepping down the output voltage of the PLP capacitors 28 to the NAND memory 16, the DRAM 20, and the controller 14 for a while after the power supply is unexpectedly shut down. The PLP function is realized wherein the data in the buffer memory 22 is non-volatilized (i.e., written to the NAND memory 16) by using the output voltage of the PLP capacitors 28.

The I2C I/F circuit 72 is connected to the control logic 70 and the bus line 40 of the controller 14 in order to communicate with the controller 14 in response to a control signal transmitted from the control logic 70. The control signal from the controller 14 is supplied to the control logic 70 via the I2C I/F circuit 72.

The health value measurement circuit 74 is connected in parallel to the plurality of PLP capacitors 28. The health value measurement circuit 74 measures the synthetic electrostatic capacitance (total capacitance) accumulated by the PLP capacitors 28 connected in parallel, and outputs the measurement result as a health value of the PLP capacitors 28. The health value is indicative of the supply capability fed from the backup power supply circuit 30. The health value corresponds to the time in which the PLP capacitors 28 can output the voltage to realize the PLP function. In other words, the health value corresponds to the size of the data which can be written to the NAND memory 16 by the output voltage of the PLP capacitors 28. If the health value is higher than or equal to a threshold value, it is determined that the PLP function can be realized. If the health value is below the threshold value, it is determined that the PLP function cannot be realized and that the SSD 4 is failed. The health value measurement circuit 74 measures and outputs the health value in a fixed cycle. The health value output from the health value measurement circuit 74 is supplied to the control logic 70 via the A/D 76.

The PLP function will be described.

First, the PLP function of a comparative example will be described. A hardware configuration of the comparative example is the same as that of the first embodiment shown in FIG. 1 to FIG. 4. A control operation of the controller 14 relating to the PLP function is different from that of the first embodiment.

In the comparative example, a single failure threshold value is set as a threshold value of the health value or supply capability for determination of the degradation of the PLP capacitors 28. The failure threshold value is set in accordance with a size of PLP target data which can be stored in the buffer memory 22 and can be written to the NAND memory 16 by the PLP function. The size may be referred to as a data storable size of the buffer memory 16. When the PLP capacitors 28 are degraded, the PLP capacitors 28 often cannot be charged to a predetermined voltage required to write all the PLP target data stored in the buffer memory 22 to the NAND memory 16 in some cases. In order to predict that the PLP capacitors 28 cannot function as PLP capacitors, the controller 14 compares the health value of the PLP capacitors 28 measured by the health value measurement circuit 74 with a failure threshold value.

Figure 5:
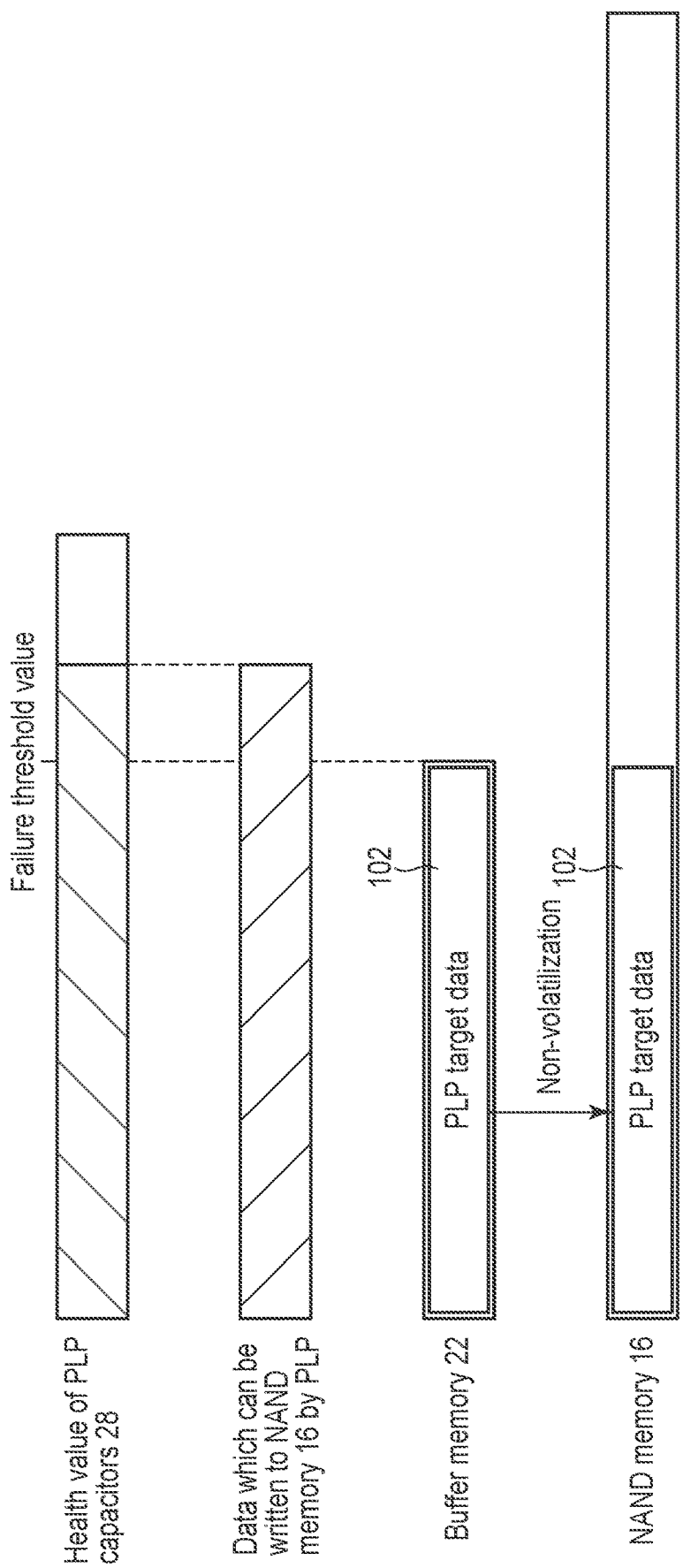
FIG. 5 is a view illustrating a PLP function of a comparative example in a case where a health value of PLP capacitors is equal to or larger than a failure threshold value.

FIG. 5 is a view illustrating the PLP function of a comparative example in a case where the health value of the PLP capacitors 28 is equal to or larger than the failure threshold value. In this case, the size of the data which can be written to the NAND memory 16 by the output voltage of the PLP capacitors 28 is larger than the size of PLP target data 102 stored in the buffer memory 22. All the PLP target data 102 can be written to the NAND memory 16 by the PLP function.

Figure 6:
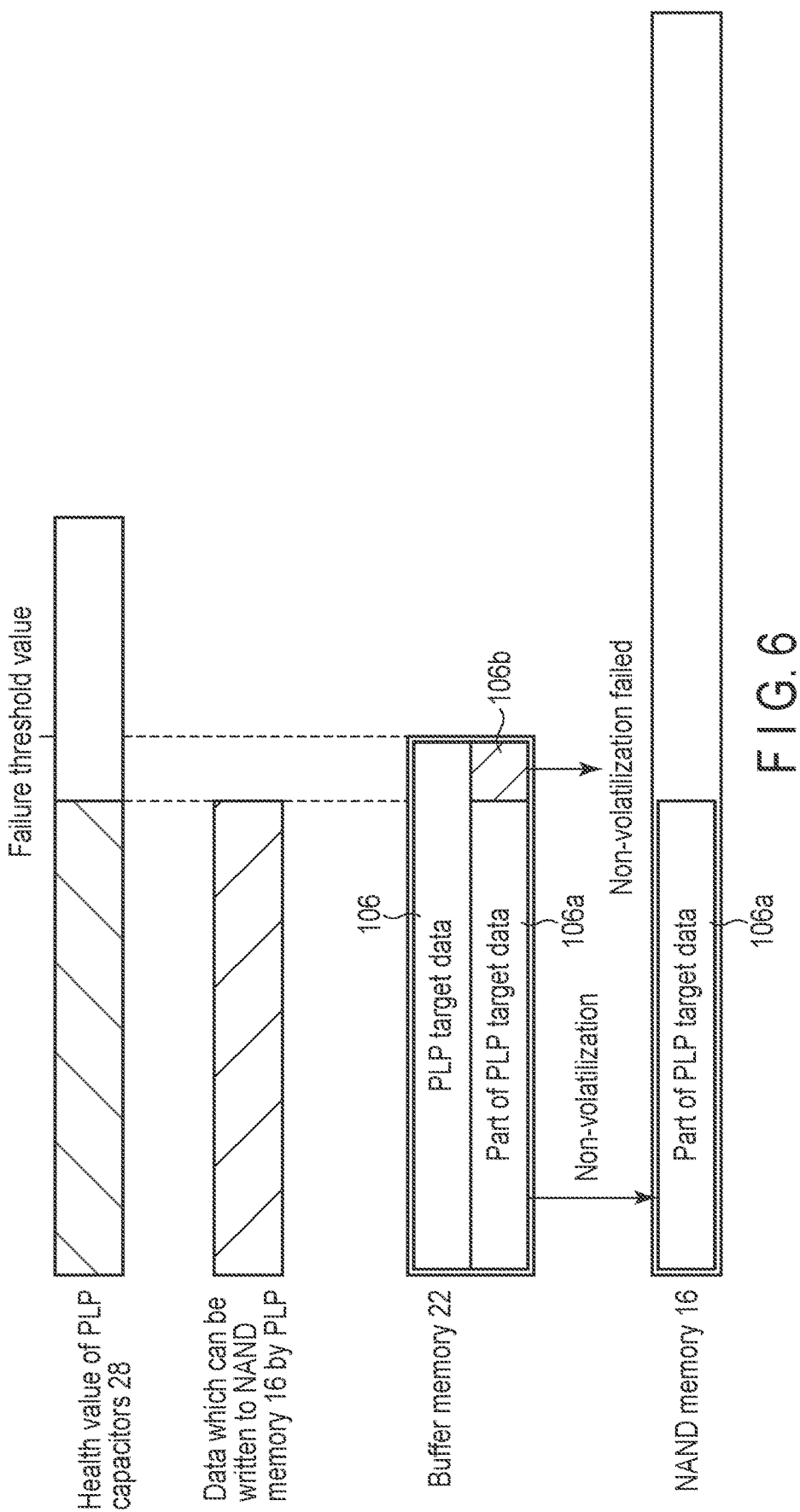
FIG. 6 is a view illustrating the PLP function of the comparative example in a case where the health value is smaller than the failure threshold value.

FIG. 6 is a view illustrating the PLP function of the comparative example in a case where the health value is smaller than the failure threshold value. In this case, the size of the size of the data which can be written to the NAND memory 16 by the output voltage of the PLP capacitors 28 is smaller than the size of PLP target data 106 stored in the buffer memory 22. A part 106a of the PLP target data 106, the part 106a corresponding to the health value, can be written to the NAND memory 16 by the PLP function, but a remaining part 106b of the PLP target data 106 cannot be written to the NAND memory 16 by the PLP function (non-volatilization is failed), and the SSD 4 is considered to have failed.

Thus, in the comparative example, when the health value is smaller than the failure threshold value, the SSD 4 is considered to have failed.

Next, the PLP function provided by the SSD 4 of the first embodiment will be described. In the first embodiment, the failure threshold value and at least one value larger than the failure threshold value are set as threshold values of the health value or supply capability for determining degradation of the PLP capacitors 28. Two values, i.e., a second threshold value larger than the failure threshold value and a first threshold value larger than the second threshold value, are set. However, only the first threshold value may be set as a value other than the failure threshold value, or three or more threshold values may be set other than the failure threshold value. In the comparative example, the threshold value of the health value is only one failure threshold value and the size of the PLP target data which can be stored in the buffer memory 22 is fixed. However, in the first embodiment, a plurality of threshold values are set and the size of the PLP target data (alternatively referred to as a valid size of the buffer memory 22) is variable. The valid size of the buffer memory 22 is the size of the maximum storable size of the buffer memory 22 in which data can be stored. The data stored in the buffer memory 16 includes data transmitted from the host 2 to the SSD 4, log data for user data, data for ECC, data related to lookup tables, and the like. The buffer memory 22 is not limited to a physical memory, but may be realized by a logical (virtual) buffer.

The controller 14 controls the writing of the buffer memory 22 such that the size of the data stored in the buffer memory 22 is not larger than or equal to the valid size. For example, when the size of the data stored in the buffer memory 22 is likely to become larger than the valid size, the controller 14 writes a part of the data stored in the buffer memory 22 to the NAND memory 16, and then reduces the size of the data stored in the buffer memory 22 by deleting the part of the data.

Initially, the controller 14 sets the valid size of the buffer memory 22 to a size corresponding to a health value larger than or equal to the first threshold value. The controller 14 compares the health value of the PLP capacitors 28 as measured by the health value measurement circuit 74 with the first threshold value.

Figure 7:
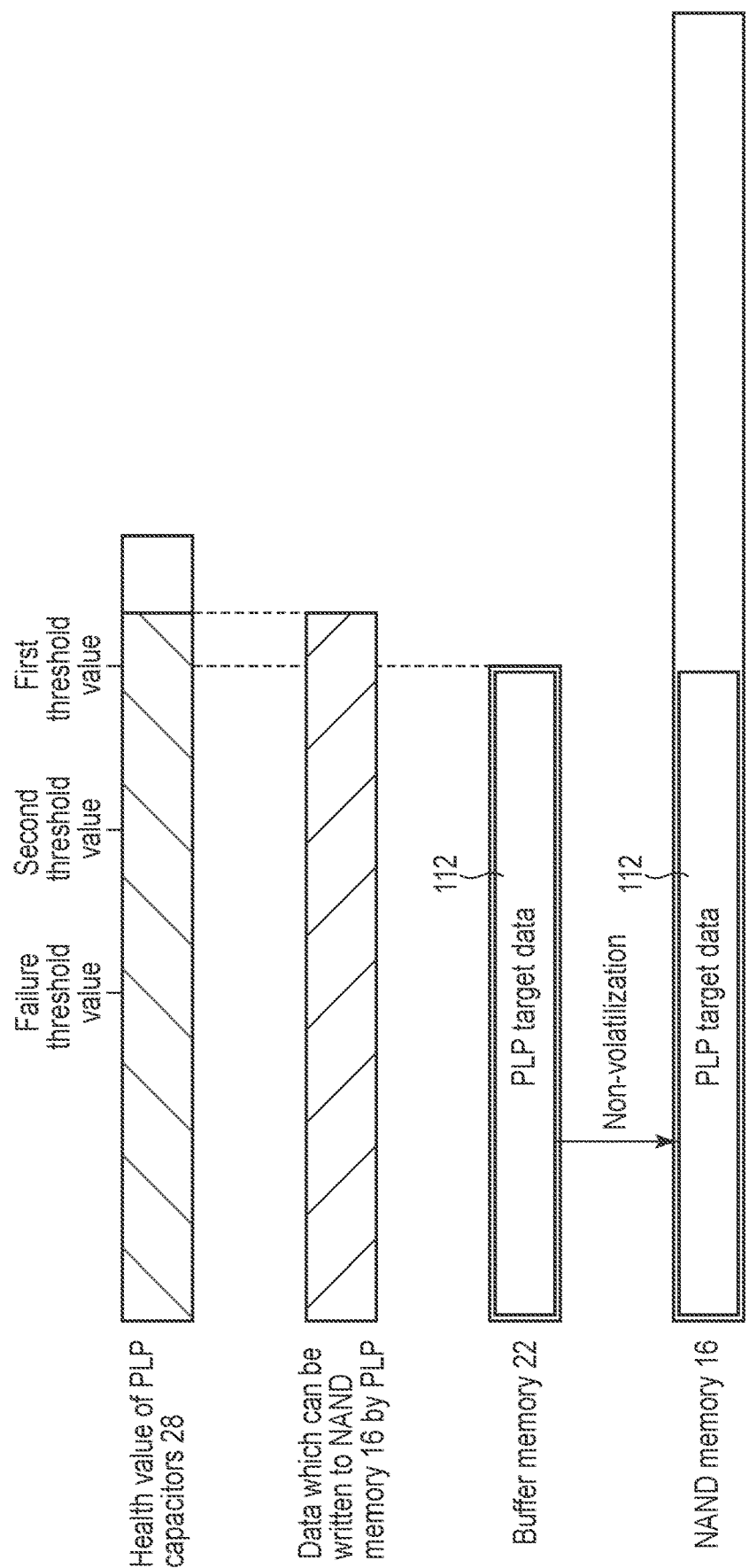
FIG. 7 is a view illustrating the PLP function according to the first embodiment in a case where the health value is larger than or equal to a first threshold value.

FIG. 7 is a view illustrating the PLP function of the SSD 4 according to the first embodiment in a case where the health value is larger than or equal to the first threshold value. In this case, the size of the data which can be written to the NAND memory 16 by the output voltage of the PLP capacitors 28 is larger than the size of PLP target data 112 stored in the buffer memory 22. All the PLP target data 112 can be written to the NAND memory 16 by the PLP function, and the PLP function operates normally.

Figure 8:
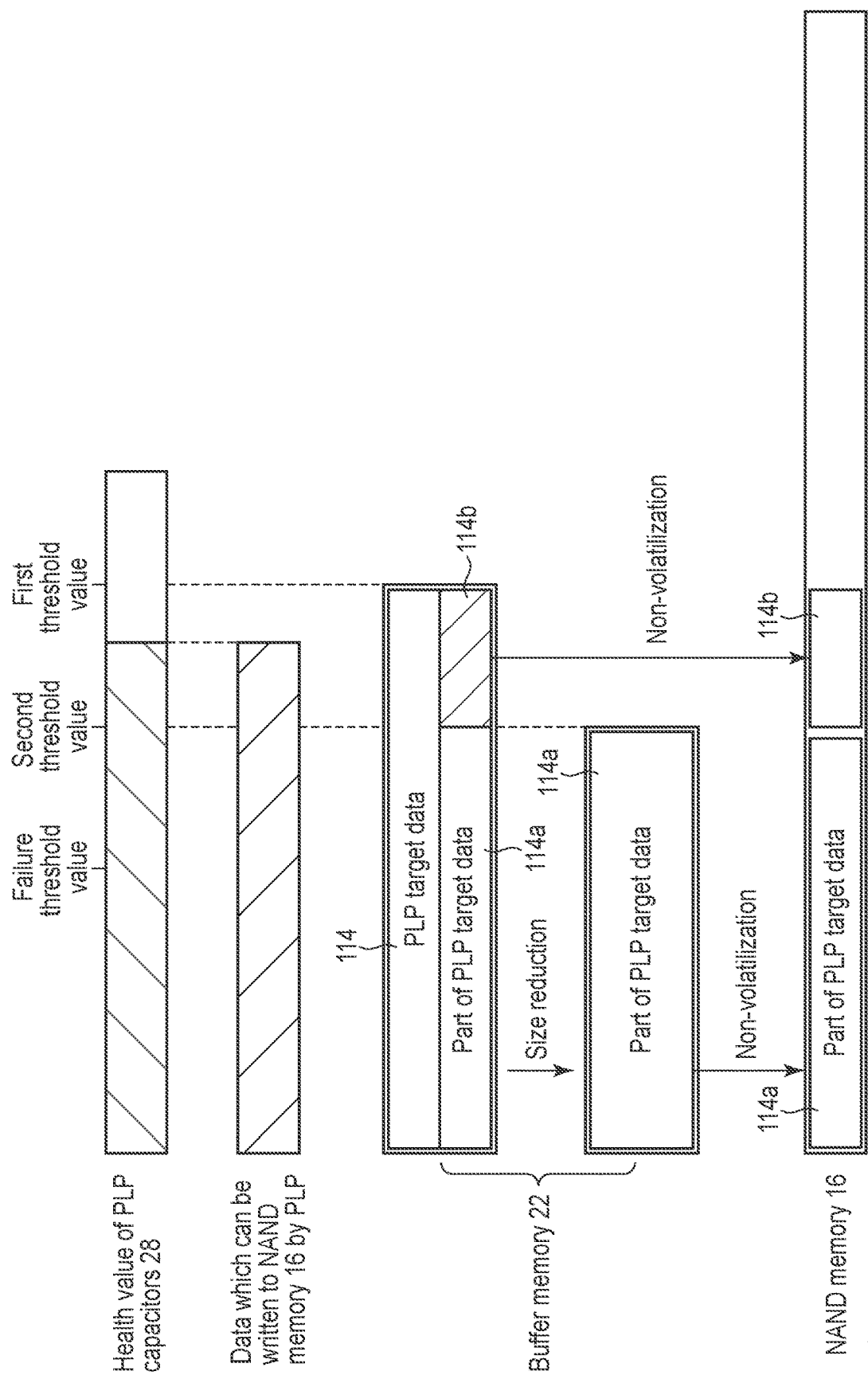
FIG. 8 is a view illustrating the PLP function according to the first embodiment in a case where the health value is smaller than the first threshold value and larger than or equal to a second threshold value.

FIG. 8 is a view illustrating the PLP function of the SSD 4 according to the first embodiment in a case where the health value is smaller than the first threshold value and larger than or equal to the second threshold value. In this case, the size of the data which can be written to the NAND memory 16 by the output voltage of the PLP capacitors 28 is smaller than the size of PLP target data 114 stored in the buffer memory 22. All the PLP target data 114 cannot be written to the NAND memory 16 by the PLP function. The controller 14 changes the valid size of the buffer memory 22 from the size corresponding to the first threshold value to the size corresponding to the second threshold value. That is, the controller 14 reduces the valid size of the buffer memory 22. The PLP target data 114 is also reduced to PLP target data 114a, which is a part thereof, by this reduction. As a result, the size of the data which can be written to the NAND memory 16 by the output voltage of the PLP capacitors 28 becomes larger than the reduced size of the PLP target data 114a. All the PLP target data 114a can be written to the NAND memory 16.

Prior to the reduction of the valid size of the buffer memory 22, the controller 14 writes data 114b, i.e., a difference between the PLP target data 114 and the reduced PLP target data 114a, to the NAND memory 16. An example of the data of the difference to be written to the NAND memory 16 is data stored in the write buffer 22a, which is being written to the NAND memory 16 or is not written to the NAND memory 16. Alternatively, an example of the data of the difference is data of a certain size including the latest data, which is written to the buffer memory 22 most recently, of the data written to the buffer memory 22.

Figure 9:
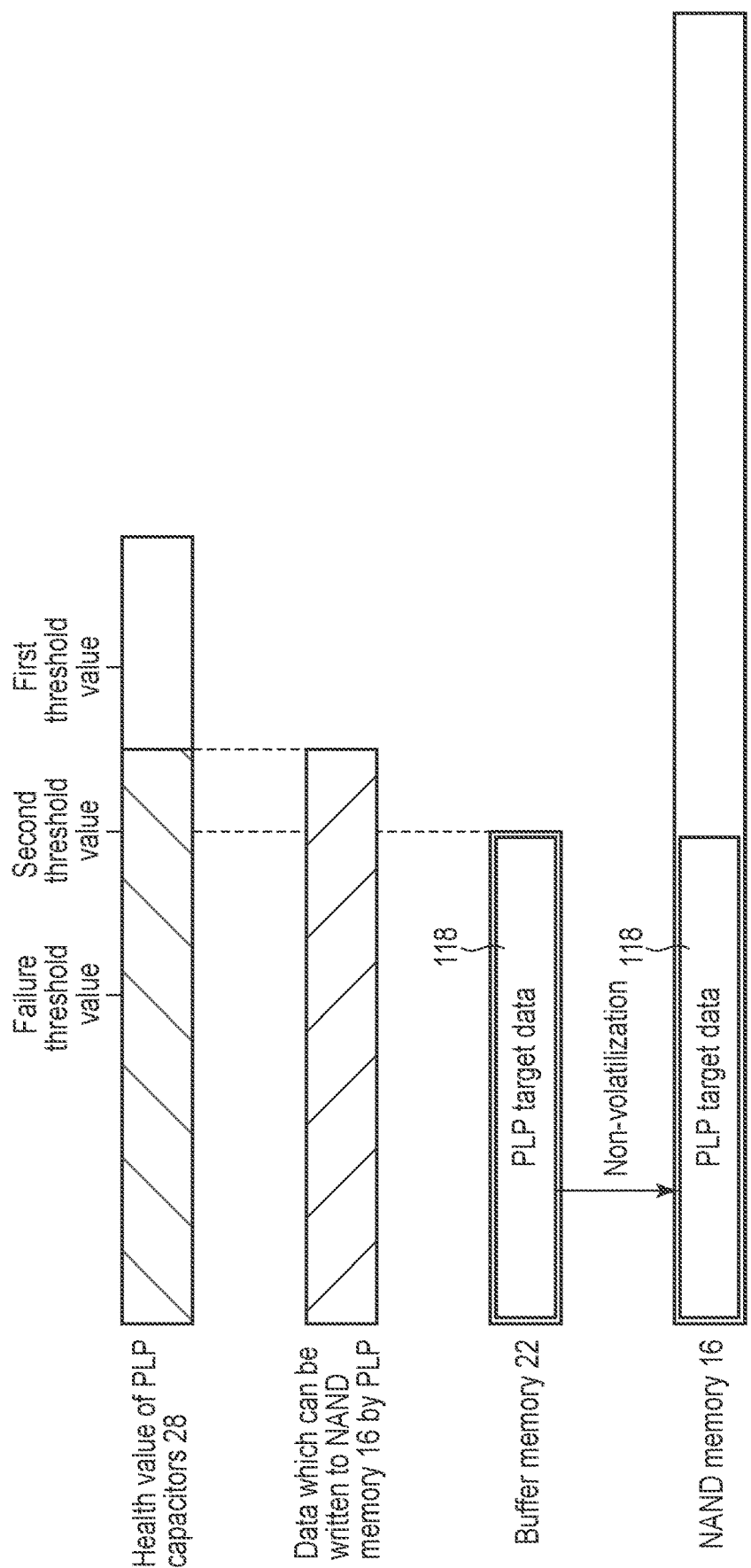
FIG. 9 is a view illustrating the PLP function according to the first embodiment in a case where the health value is smaller than the first threshold value and larger than or equal to the second threshold value.

FIG. 9 is a view illustrating the PLP function of the SSD 4 according to the first embodiment in a case where the health value is smaller than the first threshold value and larger than or equal to the second threshold value. In this case, the size of the data which can be written to the NAND memory 16 by the output voltage of the PLP capacitors 28 is larger than the size of PLP target data 118 stored in the buffer memory 22. All the PLP target data 118 can be written to the NAND memory 16 by the PLP function, and the PLP function operates normally.

FIG. 10 is a view illustrating the PLP function of the SSD 4 according to the first embodiment in a case where the health value is smaller than the second threshold value and larger than or equal to the failure threshold value. In this case, the size of the data which can be written to the NAND memory 16 by the output voltage of the PLP capacitors 28 is smaller than the size of PLP target data 122 stored in the buffer memory 22. All the PLP target data 122 cannot be written to the NAND memory 16 by the PLP function. The controller 14 changes the valid size of the buffer memory 22 from the size corresponding to the second threshold value to the size corresponding to the failure threshold value. That is, the controller 14 reduces the valid size of the buffer memory 22. The PLP target data 122 is also reduced to PLP target data 122*a*, which is a part thereof, by this reduction. As a result, the size of the data which can be written to the NAND memory 16 by the output voltage of the PLP capacitors 28 becomes larger than the reduced size of the PLP target data 122*a*. All the PLP target data 122*a* can be written to the NAND memory 16.

Prior to the reduction of the valid size of the buffer memory 22, the controller 14 writes data 122*b*, i.e., a difference between the PLP target data 122 and the reduced PLP target data 122*a*, to the NAND memory 16. An example of the data of the difference to be written to the NAND memory 16 is data stored in the write buffer 22*a*, which is being written to the NAND memory 16 or is not written to the NAND memory 16. Alternatively, an example of the data of the difference is data of a certain size including the latest data, which is written to the buffer memory 22 most recently, of the data written to the buffer memory 22.

FIG. 11 is a view illustrating the PLP function of the SSD 4 according to the first embodiment in a case where the health value is smaller than the second threshold value and larger than or equal to the failure threshold value. In this case, the size of the data which can be written to the NAND memory 16 by the output voltage of the PLP capacitors 28 is larger than the size of PLP target data 126 stored in the buffer memory 22. All the PLP target data 126 can be written to the NAND memory 16 by the PLP function, and the PLP function operates normally.

FIG. 12 is a view illustrating the PLP function of the SSD 4 according to the first embodiment in a case where the health value is smaller than the failure threshold value. In this case, the size of the data which can be written to the NAND memory 16 by the output voltage of the PLP capacitors 28 is smaller than the size of PLP target data 128 stored in the buffer memory 22. A part 128*a* of the PLP target data 128, the part 128*a* corresponding to the health value can be written to the NAND memory 16 by the PLP function, but a remaining part 128*b* cannot be written to the NAND memory 16 by the PLP function (non-volatilization is failed), the PLP function cannot operate normally, and the SSD 4 is considered to have failed.

Figure 13:
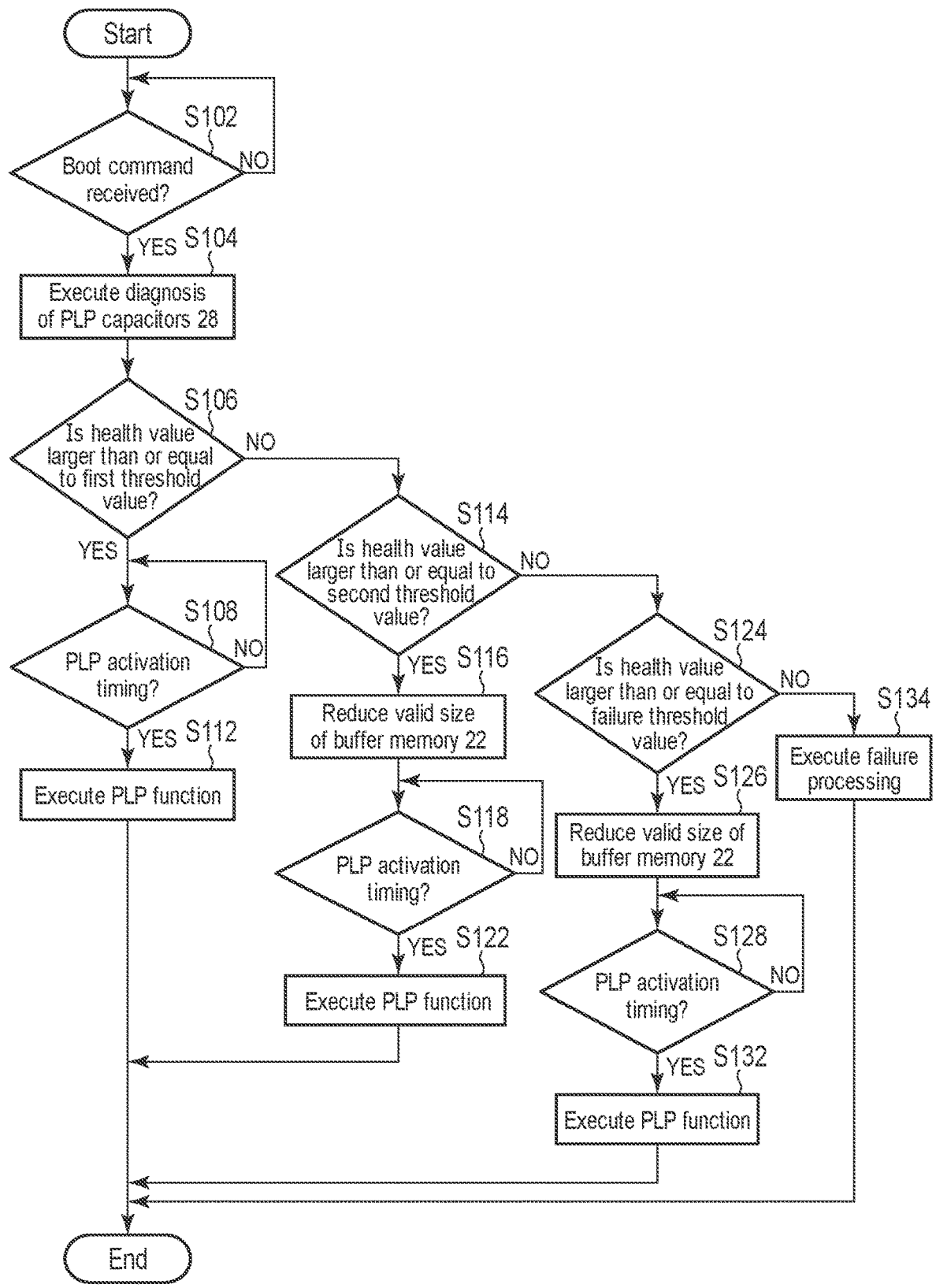
FIG. 13 is a flowchart showing an example of processing of a controller executing the PLP function according to the first embodiment.

FIG. 13 is a flowchart showing an example of processing of the controller 14 executing the PLP function of the SSD 4 according to the first embodiment shown in FIG. 7 to FIG. 12.

In step S102, the controller 14 determines whether the controller 14 has received a boot command from the host 20. The controller 14 repeats the determination of step S102 until the controller 14 receives the boot command. The DDS 4 may set the first threshold value, the second threshold value, and the failure threshold value. Alternately, the host 2 may set these threshold values. When the host 2 sets these threshold values in the SSD 4, the host 2 may transmit the boot command to the SSD 4 with information indicative of the threshold values.

When receiving the boot command (YES in S102), the controller 14 executes diagnosis of the PLP capacitors 28 in step S104. More specifically, the controller 14 receives the health value measured by the health value measurement circuit 74.

In step S106, the controller 14 determines whether the health value is larger than or equal to the first threshold value. When the health value is larger than or equal to the first threshold value (YES in S106), the controller 14 determines whether the PLP activation timing has come, in step S108. When the controller 14 is notified by the control logic 70 that the output voltage of the load switch 64 has become 0V, even though the controller 14 has not received the shutdown command, the controller 14 determines that the PLP activation timing has come.

The controller 14 repeats the determination of step S108 until the PLP activation timing comes. When the PLP activation timing comes (YES in S108), the controller 14 executes the PLP function in step S112. In this case, all the PLP target data 112 is non-volatilized as shown in FIG. 7.

When it is determined in step S106 that the health value is smaller than the first threshold value (NO in S106), the controller 14 determines in step S114 whether the health value is larger than or equal to the second threshold value. When the health value is larger than or equal to the second threshold value (YES in S114), the controller 14 reduces the valid size of the buffer memory 22 to the size corresponding to the second threshold value, in step S116, as shown in FIG. 8 since the health value is smaller than the first threshold and larger than or equal to the second threshold value.

In step S118, the controller 14 determines whether the PLP activation timing has come. The controller 14 repeats the determination of step S118 until the PLP activation timing comes. When the PLP activation timing comes (YES in S118), the controller 14 executes the PLP function in step S122. In this case, all the PLP target data 118 is non-volatilized as shown in FIG. 9.

When it is determined in step S114 that the health value is smaller than the second threshold value (NO in S114), the controller 14 determines in step S124 whether the health value is larger than or equal to the failure threshold value. When the health value is larger than or equal to the failure threshold value (YES in S124), the health value is smaller than the second threshold value and larger than or equal to the failure threshold value, and the controller 14 reduces the valid size of the buffer memory 22 to the size corresponding to the failure threshold value, in step S126, as shown in FIG. 10.

In step S128, the controller 14 determines whether the PLP activation timing has come. The controller 14 repeats the determination of step S128 until the PLP activation timing comes. When the PLP activation timing comes (YES in S128), the controller 14 executes the PLP function in step S132. In this case, all the PLP target data 126 is non-volatilized as shown in FIG. 11.

When it is determined in step S124 that the health value is smaller than the failure threshold value (NO in S124), the controller 14 executes failure processing in step S134. As an example of the failure processing, the controller 14 may notify the host 2 that the PLP function does not work properly since the performance of the PLP capacitors 28 is degraded, i.e., that the SSD 4 has failed.

Figure 14:
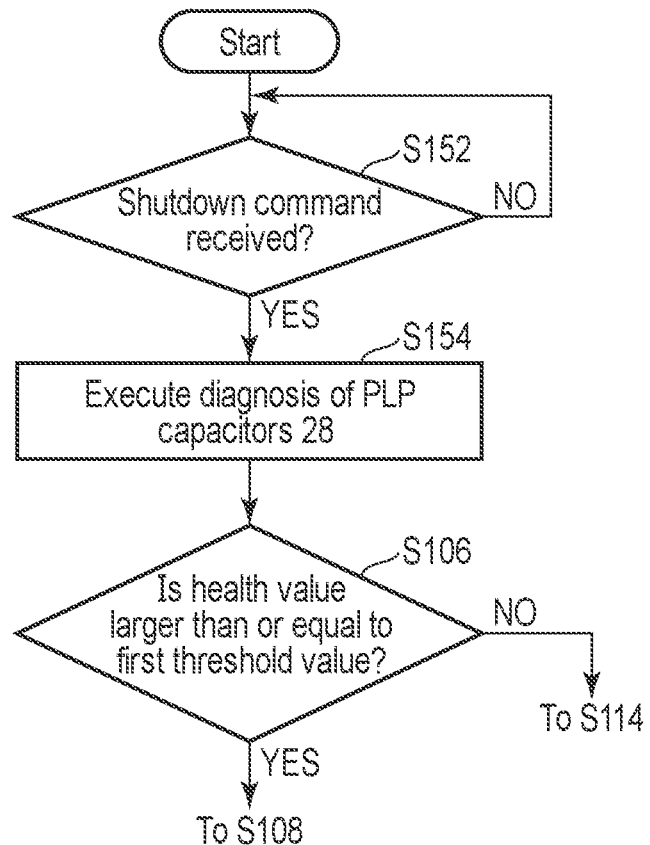
FIG. 14 is a flowchart showing another example of the processing of the controller executing the PLP function according to the first embodiment.

FIG. 14 is a flowchart showing another example of the processing of the controller 14 executing the PLP function of the SSD 4 according to the first embodiment as shown in FIG. 7 to FIG. 12 includes.

In step S152, the controller 14 determines whether the controller 14 has received a shutdown command from the host 2. The controller 14 repeats the determination of step S152 until the controller 14 receives the shutdown command. The host 2 may transmit the shutdown command to the SSD 4 with information indicative of the first threshold value, the second threshold value, and the failure threshold value.

When receiving the shutdown command (YES in S152), the controller 14 executes diagnosis of the PLP capacitors 28 in step S154. After that, the controller 14 determines in step S106 whether the health value is larger than or equal to the first threshold value, similarly to the processing shown in FIG. 13. After that, the valid size of the buffer memory 22 is changed in some cases. The changed valid size is persistently stored in the NAND memory 16.

FIG. 13 shows an example of executing diagnosis of the PLP capacitors 28 at a boot time, and FIG. 14 shows an example of executing diagnosis of the PLP capacitors 28 at a shutdown time. The diagnosis of the PLP capacitors 28 and the change of the valid size of the buffer memory 22 may be executed at the time other than these times. For example, the diagnosis may be executed when the command processing of the host 2 is infrequent or executed at regular intervals.

According to the first embodiment, even when the performance of the PLP capacitors 28 is deteriorated and the synthetic electrostatic capacitance of the PLP capacitors 28 decreases, the controller 14 does not determine immediately that the PLP function will work improperly, but sets to reduce the valid size of the buffer memory 22, (i.e., the PLP target data size), so as to continue the operation of the PLP function. By reducing the valid size of the buffer memory 22, the frequency of waiting for the buffer memory 22 having enough free space corresponding to the size of data to be written, and the execution frequency of the internal processing of the SSD 4 that writes the data in the buffer memory 22 to the NAND memory 16 increases. The time at which the PLP function stops and the SSD 4 is finally failed can be delayed although the processing capacity of the SSD 4 for commands from the host 2 is somewhat reduced. In other words, the operation period of the SSD 4 can be extended.

Figure 15:
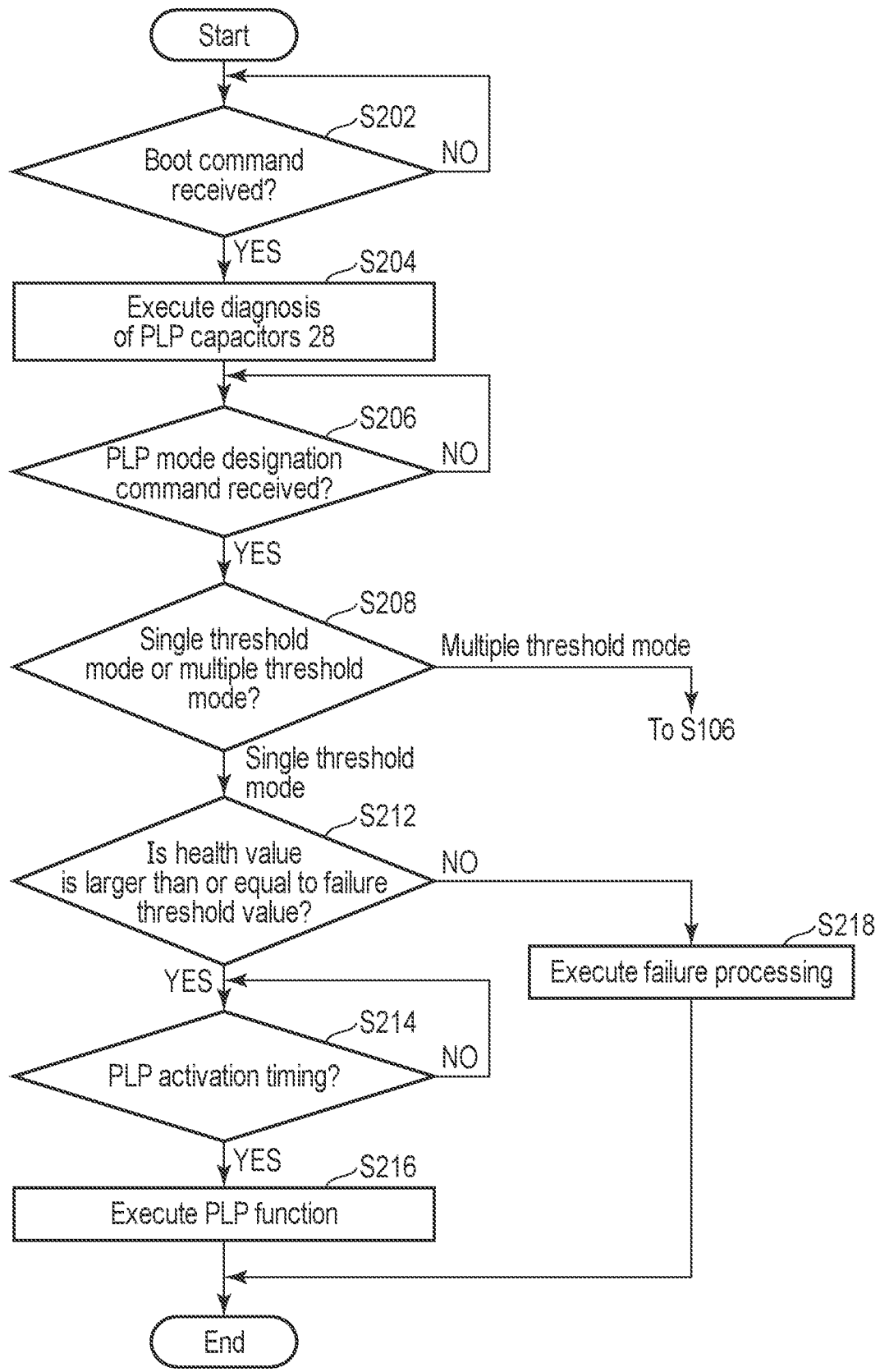
FIG. 15 is a flowchart showing an example of processing of the controller executing the PLP function according to a second embodiment.

FIG. 15 is a flowchart showing an example of processing of the controller 14 executing the PLP function according to a second embodiment. A hardware configuration of the second embodiment is the same as that of the first embodiment shown in FIG. 1 to FIG. 4. A control operation of the controller 14 relating to the PLP function is different from that of the first embodiment.

In step S202, the controller 14 determines whether the controller 14 has received a boot command from the host 20. The controller 14 repeats the determination of step S102 until the controller 14 receives the boot command. The host 2 may transmit the boot command to the SSD 4 with information indicative of the first threshold value, the second threshold value, and the failure threshold value.

When receiving the boot command (YES in S202), the controller 14 executes diagnosis of the PLP capacitors 28 in step S204.

In step S206, the controller 14 determines whether the controller 14 has received a PLP mode designation command from the host 20. In the second embodiment, a single threshold mode in which a value of a health value is only a failure threshold value as set in the comparative example and a multiple threshold mode in which values of the health value include at least one threshold value other than the failure threshold value as set in the first embodiment are set as a PLP mode. After transmitting the boot command to the SSD 4, the host 2 transmits the PLP mode designation command to designate the single threshold mode or the multiple threshold mode. The controller 14 repeats the determination of step S206 until the controller 14 receives the PLP mode designation command.

When receiving the PLP mode designation command (YES in S206), the controller 14 determines in step S208 whether the PLP mode designation command designates the single threshold mode or the multiple threshold mode. When the multiple threshold mode is specified, the controller 14 determines whether the health value is larger than or equal to the first threshold value, in step S106, similarly to the first embodiment. After that, the valid size of the buffer memory 22 is changed in some cases.

When specifying the single threshold mode, the controller 14 determines whether the health value is larger than or equal to the failure threshold value in step S212. When the health value is larger than or equal to the failure threshold value (YES in S212), the controller 14 determines whether the PLP activation timing has come. The controller 14 repeats the determination of step S214 until the PLP activation timing comes. When the PLP activation timing comes (YES in S214), the controller 14 executes the PLP function in step S216. In this case, all the PLP target data 102 is non-volatilized as shown in FIG. 5. The failure threshold value of the single threshold mode is set to a value different from the failure threshold value of the multiple threshold mode. For example, the failure threshold value of the single threshold mode may be set to the first threshold value of the multiple threshold mode.

When it is determined in step S212 that the health value is smaller than the failure threshold value (NO in S212), the controller 14 executes the failure processing in step S218.

The host 2 may transmit the PLP mode designation command after the shutdown command, transmit the command when the host 2 processes fewer commands, or transmit the command at regular intervals.

According to the second embodiment, the SSD 4 has, as the PLP modes, the single threshold mode with a single threshold value of the health value of the PLP capacitors 28 for determining a failure of the PLP function and the multiple threshold mode with the multiple threshold values, and the host 2 can select the PLP mode.

Figure 16:
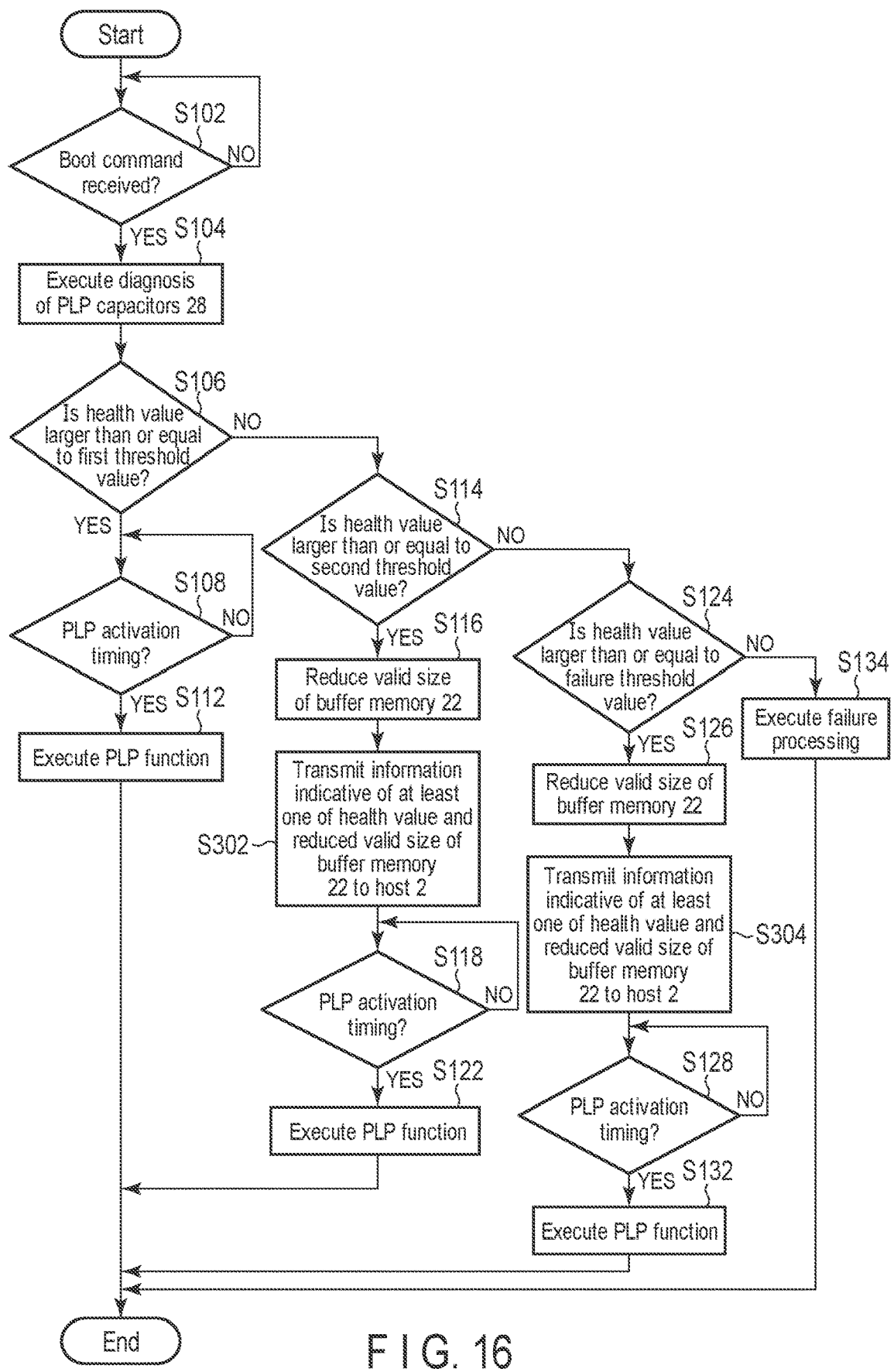
FIG. 16 is a flowchart showing an example of processing of the controller executing the PLP function according to a third embodiment.

FIG. 16 is a flowchart showing an example of processing of the controller 14 executing the PLP function according to a third embodiment. A hardware configuration of the third embodiment is the same as that of the first embodiment shown in FIG. 1 to FIG. 4. A control operation of the controller 14 relating to the PLP function is different from that of the first embodiment. In the flowchart of FIG. 16, the same processes as those of FIG. 13 are denoted by the same reference numbers.

The controller 14 receives a boot command (step S102), executes diagnosis of the PLP capacitors 28 (step 104), and determines whether the health value is larger than or equal to the first threshold value (step S106).

When the health value is smaller than the first threshold value (NO in S106), the controller 14 determines whether the health value is larger than or equal to the second threshold value (step S114).

When the health value is larger than or equal to the second threshold value (YES in S114), the controller 14 reduces the valid size of the buffer memory 22 to the size corresponding to the second threshold value, in step S116. The controller 14 transmits information indicative of at least one of the health value of the PLP capacitors 28 and the reduced valid size of the buffer memory 22 to the host 2, in step S302. In step S118, the controller 14 determines whether the PLP activation timing has come.

When the health value is smaller than the second threshold value (NO in S114), the controller determines whether the health value is larger than or equal to the failure threshold value (step S124). When the health value is larger than or equal to the failure threshold value (YES in S124), the controller 14 reduces the valid size of the buffer memory 22 to the size corresponding to the failure threshold value, in step S126. The controller 14 transmits information indicative of at least one of the health value of the PLP capacitors 28 and the reduced valid size of the buffer memory 22 to the host 2, in step S304. In step S128, the controller 14 determines whether the PLP activation timing has come.

When the health value is smaller than the failure threshold value (NO in S124), the controller 14 executes failure processing in step S134.

According to the third embodiment, the host 2 can receive the information indicative of at least one of the health value of the PLP capacitors 28 and the reduced valid size of the buffer memory 22. The host 2 can predict the time until the SSD 4 fails due to the failure of the PLP function, from the change in the health value of the PLP capacitors 28. Alternatively, the host 2 can predict the time until the SSD 4 fails due to the failure of the PLP function, from a reduction rate of the valid size of the buffer memory 22 (=(C−B)/C) where C is an initial value of the valid size of the buffer memory 22 and B is the reduced valid size of the buffer memory 22.

The modified example (FIG. 14) that the diagnosis of the PLP capacitors 28 is executed after receiving the shutdown command has been described in the first embodiment. The diagnosis of the PLP capacitors 28 may also be executed after receiving the shutdown command, in the third embodiment. In this case, the controller 14 transmits information indicative of at least one of the health value of the PLP capacitors 28 and the reduced valid size of the buffer memory 22 to the host 2 after the receipt of the shutdown command and the diagnosis of the PLP capacitors 28.

FIG. 17 is a flowchart showing an example of processing of the controller 14 executing the PLP function according to a fourth embodiment. A hardware configuration of the fourth embodiment is the same as that of the first embodiment shown in FIG. 1 to FIG. 4. A control operation of the controller 14 relating to the PLP function is different from that of the first embodiment.

In step S312, the controller 14 determines whether the controller 14 has received a notification request command from the host 20. The controller 14 executes the determination of step S312 in the background while executing the other process. The host 20 transmits the notification request command to the controller 14 at timing when the host 20 requires from the controller 14 the information indicative of at least one of the health value of the PLP capacitors 28 and the reduced valid size of the buffer memory 22. The controller 14 repeats the determination of step S132 until the controller 14 receives the notification request command.

When receiving the notification request command (YES in S312), the controller 14 executes diagnosis of the PLP capacitors 28 in step S314.

In step S316, the controller 14 transmits the information indicative of at least one of the health value of the PLP capacitors 28 and the valid size of the buffer memory 22 to the host 2.

According to the fourth embodiment, the host 2 can receive the information indicative of at least one of the health value of the PLP capacitors 28 and the valid size of the buffer memory 22 at the required timing.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modification as would fall within the scope and spirit of the inventions.

What is claimed is:

1. A memory system comprising:
a non-volatile memory including a write buffer configured to store data which is being written or is not written to the non-volatile memory, a read buffer configured to store data which is read from the non-volatile memory and which is being transmitted or is not transmitted to an external device, and a management data buffer configured to store management data to write data to the non-volatile memory;
a volatile memory;
a controller configured to control writing data to the non-volatile memory and writing data to the volatile memory;
a power supply circuit coupled to the non-volatile memory, the volatile memory, and the controller and configured to generate voltages with a first voltage which is externally supplied and supply the voltages to the non-volatile memory, the volatile memory, and the controller; and
a backup power supply circuit configured to be charged with one of the voltages, wherein
the power supply circuit is configured to, when the first voltage drops irrespective of a shutdown command, generate the voltages with an output voltage from the backup power supply circuit, and
the controller is configured to change a size of data storable in the volatile memory in accordance with a supply capability fed from the backup power supply circuit, and
the controller is configured to, when the supply capability is smaller than the first value, write data in the write buffer to the non-volatile memory, and reduce the size of the data storable in the volatile memory by a size of the write buffer.

2. The memory system of claim 1, wherein the backup power supply circuit includes a plurality of capacitors and the supply capability corresponds to an electrostatic capacitance of the plurality of capacitors charged.

3. The memory system of claim 1, wherein
the controller is configured to, after reducing the size of the data storable in the volatile memory and when the supply capability is smaller than a second value that is smaller than the first value, write second data of the data stored in the volatile memory, to the non-volatile memory, and reduce the size of the data storable in the volatile memory by a size of the second data.

4. The memory system of claim 1, wherein
the controller is configured to receive a second value which is smaller than the first value, and
the controller is configured to, after reducing the size of the data storable in the volatile memory and when the supply capability is smaller than the second value, write second data of data stored in the volatile memory, to the non-volatile memory, and reduce the size of the data storable in the volatile memory by a size of the second data.

5. The memory system of claim 1, wherein
the controller is configured to, after reducing the size of the data storable in the volatile memory and when the supply capability is smaller than a second value which is smaller than the first value, write data in the write buffer to the non-volatile memory and reduce the size of data storable in the volatile memory by a size of the write buffer.

6. The memory system of claim 1, wherein
the controller is configured to, when the supply capability is smaller than the first value, write data of a certain size, the data including latest data which is written to the volatile memory most recently, to the non-volatile memory, and reduce the size of the data storable in the volatile memory by the certain size.

7. The memory system of claim 6, wherein
the controller is configured to, after reducing the size of the data storable in the volatile memory and when the supply capability is smaller than a second value which is smaller than the first value, write data of a certain size, the data including latest data which is written to the volatile memory most recently, to the non-volatile memory, and reduce the size of the data storable in the volatile memory by the certain size.

8. The memory system of claim 1, wherein
the power supply circuit is configured to, when the first voltage is smaller than a first level at a time of not receiving a shutdown command from an external device, supply a voltage corresponding to an output voltage of the backup power supply circuit to the non-volatile memory, the volatile memory, and the controller.

9. A memory system comprising:
a non-volatile memory;
a volatile memory;
a controller configured to control writing data to the non-volatile memory and writing data to the volatile memory;
a power supply circuit coupled to the non-volatile memory, the volatile memory, and the controller and configured to generate voltages with a first voltage which is externally supplied and supply the voltages to the non-volatile memory, the volatile memory, and the controller; and
a backup power supply circuit configured to be charged with one of the voltages, wherein
the power supply circuit is configured to, when the first voltage drops irrespective of a shutdown command, generate the voltages with an output voltage from the backup power supply circuit,
the controller is configured to change a size of data storable in the volatile memory in accordance with a supply capability fed from the backup power supply circuit, the controller is configured to receive information indicative of a first value from an external device,
the controller is configured to, when the supply capability is smaller than the first value, write first data of data stored in the volatile memory, to the non-volatile memory, and reduce the size of the data storable in the volatile memory by a size of the first data, and
the controller is configured to, when the supply capability is smaller than a third value which is smaller than the first value, transmit information indicative of the supply capability to the external device.

10. The memory system of claim 9, wherein
the controller is configured to receive information indicative of the third value smaller than the first value from the external device, and
the controller is configured to, when the supply capability is smaller than the third value, transmit information indicative of the supply capability to the external device.

11. A memory system comprising:
a non-volatile memory;
a volatile memory;
a controller configured to control writing data to the non-volatile memory and writing data to the volatile memory;
a power supply circuit coupled to the non-volatile memory, the volatile memory, and the controller and configured to generate voltages with a first voltage which is externally supplied and supply the voltages to the non-volatile memory, the volatile memory, and the controller; and
a backup power supply circuit configured to be charged with one of the voltages, wherein
the power supply circuit is configured to, when the first voltage drops irrespective of a shutdown command, generate the voltages with an output voltage from the backup power supply circuit,
the controller is configured to change a size of data storable in the volatile memory in accordance with a supply capability fed from the backup power supply circuit, and
the controller is configured to transmit information indicative of at least one of the supply capability and the size of the data storable in the volatile memory to an external device.

12. The memory system of claim 11, wherein
the controller is configured to, after reducing the size of the data storable in the volatile memory, transmit information indicative of at least one of the supply capability and the storable data size to the external device.

13. The memory system of claim 11, wherein
the controller is configured to, after receiving a notification request from the external device, transmit information indicative of at least one of the supply capability and the size of data storable in the volatile memory to the external device.

14. A memory system comprising:
a non-volatile memory;
a volatile memory;
a controller configured to control writing data to the non-volatile memory and writing data to the volatile memory;
a power supply circuit coupled to the non-volatile memory, the volatile memory, and the controller and configured to generate voltages with a first voltage which is externally supplied and supply the voltages to the non-volatile memory, the volatile memory, and the controller; and a backup power supply circuit configured to be charged with one of the voltages, wherein the power supply circuit is configured to, when the first voltage drops irrespective of a shutdown command, generate the voltages with an output voltage from the backup power supply circuit, the controller is configured to operate in one of a first mode and a second mode, the controller is configured to change a size of data storable in the volatile memory when a supply capability fed from the backup power supply is smaller than a first value and transmit information indicative of the supply capability to an external device when the supply capability is smaller than a second value which is smaller than the first value in the first mode, and the controller is configured to transmit information indicative of the supply capability to the external device when the supply capability is smaller than a third value which is smaller than the second value in the second mode.

15. The memory system of claim 14, wherein the backup power supply circuit includes a plurality of capacitors and the supply capability corresponds to an electrostatic capacitance of the plurality of capacitors charged.

16. The memory system of claim 14, wherein the controller is configured to receive a mode designation signal to designate one of the first mode and the second mode from the external device.

17. The memory system of claim 14, wherein the controller is configured to, when the supply capability is smaller than the first value, write first data of data stored in the volatile memory, to the non-volatile memory, and reduce the size of the data storable in the volatile memory by a size of the first data.

18. The memory system of claim 14, wherein the power supply circuit is configured to, when the first voltage is smaller than a first level at a time of not receiving a shutdown command from an external device, supply a voltage corresponding to an output voltage of the backup power supply circuit to the non-volatile memory, the volatile memory, and the controller.

* * * * *